United States Patent [19]

Mulholland et al.

[11] Patent Number: 4,627,151
[45] Date of Patent: Dec. 9, 1986

[54] AUTOMATIC ASSEMBLY OF INTEGRATED CIRCUITS

[75] Inventors: Wayne A. Mulholland, Plano; Daniel J. Quinn; Robert H. Bond, both of Carrollton; Michael A. Olla, Flower Mound, all of Tex.

[73] Assignee: Thomson Components-Mostek Corporation, Carrollton, Tex.

[21] Appl. No.: 592,185

[22] Filed: Mar. 22, 1984

[51] Int. Cl.⁴ ............................................. H01L 21/28
[52] U.S. Cl. ................................ 29/569 R; 29/577 C; 29/589; 29/831; 228/179; 228/4.1
[58] Field of Search .................... 29/569 R, 571, 574, 29/577 R, 577 C, 591, 827, 831, 576 S, 589; 357/70; 228/4.1, 64, 179; 148/1.5

[56] References Cited

U.S. PATENT DOCUMENTS

| | | | |
|---|---|---|---|
| 3,709,424 | 1/1973 | Drees | 228/4.1 X |
| 3,777,365 | 12/1973 | Umbaugh | 29/591 |
| 3,793,714 | 2/1974 | Bylander | 29/591 X |
| 3,795,043 | 3/1974 | Forlani | 29/591 X |
| 3,864,820 | 2/1975 | Brenan et al. | 29/591 |
| 3,906,621 | 9/1975 | Epple | 29/591 |
| 3,941,297 | 3/1976 | Burns et al. | 228/4.1 X |
| 3,968,563 | 7/1976 | Hamlin | 29/591 |
| 3,997,100 | 12/1976 | Hofmeister | 228/4.1 X |
| 4,003,125 | 1/1977 | Wallick | 29/591 X |
| 4,023,260 | 5/1977 | Schneider | 29/591 X |
| 4,071,180 | 1/1978 | Dupuis | 29/591 X |
| 4,189,825 | 2/1980 | Robillard et al. | 29/591 X |
| 4,232,815 | 11/1980 | Nakano et al. | 357/70 X |
| 4,312,117 | 1/1982 | Robillard et al. | 29/591 X |
| 4,479,298 | 10/1984 | Huy | 357/70 X |

FOREIGN PATENT DOCUMENTS

| | | | |
|---|---|---|---|
| 0024778 | 3/1978 | Japan | 29/569 R |
| 0152964 | 12/1979 | Japan | 228/6 A |
| 7604900 | 11/1976 | Netherlands | 228/6 A |

Primary Examiner—Brian E. Hearn
Assistant Examiner—David A. Hey
Attorney, Agent, or Firm—Roland Plottel

[57] ABSTRACT

A system for the assembly and packaging of integrated circuits employs circuit dice that have contact pads in a standard array; a leadframe having leads configured to have the same spring constant; a method for removing selected dice from a wafer array under computer control; and a method of simultaneously bonding all leads to the die.

7 Claims, 34 Drawing Figures

QUADRANT 20
28 PLACES

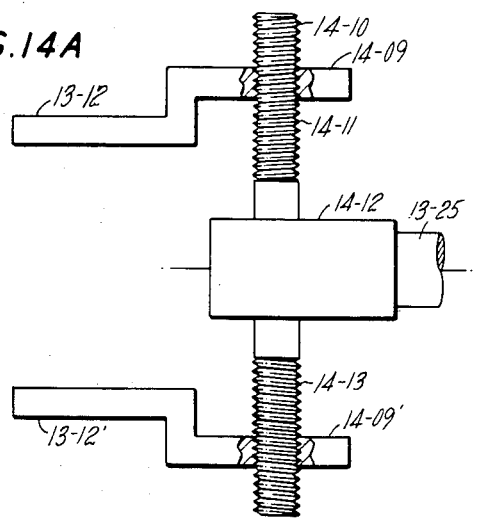
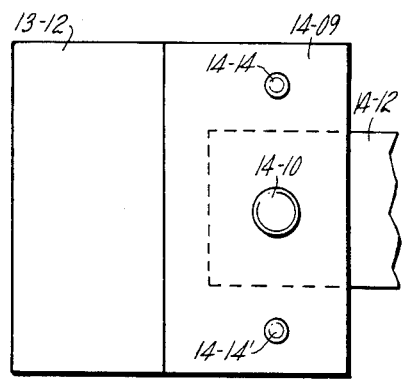
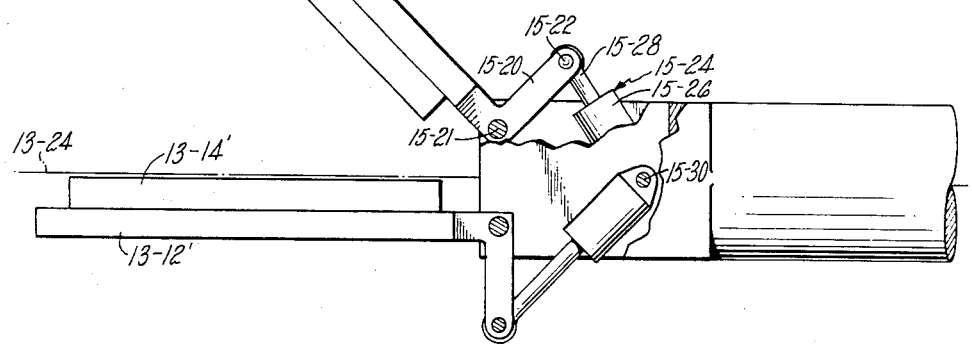
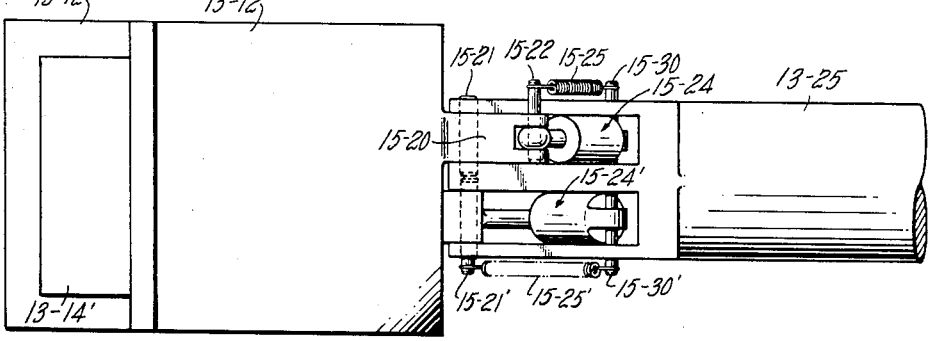

AUTOMATIC ASSEMBLY OF INTEGRATED CIRCUITS

TECHNICAL FIELD

The field of the invention is that of attaching leads to integrated circuit chips and encapsulating the chip plus lead combination in plastic.

BACKGROUND ART

The assembly operation for integrated circuits, sometimes referred to as the "back-end", consists of taking a silicon wafer containing several dozen or more integrated circuit chips; testing, sometimes referred to as "probing", the chips to determine which are working and which are not; cutting the wafer apart to produce individual chips; attaching the chip to a leadframe; bonding wires to the leads one at a time; and encapsulating the combination in plastic to provide protection for the device and cutting and forming the external leads of the leadframe to their final shape.

The standard method of attaching wires to the chip is by wire bonding, in which a gold or aluminum alloy wire is pressed very hard (in the presence of elevated temperatures and/or ultrasonic energy) against a pad on the chip until a bond is formed. One wire is done at a time. This method uses a great deal of labor and expensive materials. Automated wire bonding machines are known, but they have an inherent limitation. Even with the most rapid machines that can be imagined, there are factors that provide a necessary limitation to approximately 2,000 units per hour for a 16 pin chip. With wire bonding techniques, it is also necessary to attach the chip to the package or leadframe in order to maintain it in position while the wire bonds are formed. Also, the leads in this process must be typically made of an expensive expansion-controlled alloy in order to have the correct thermal expansion matching between the chip and the leads when gold-silicon eutectic die bonding is used or expensive special alloys or adhesives must be used to correct the thermal mismatch. Also, the leads must be plated with gold, silver or other precious metal so that the bonding wire can form a reliable connection to the lead.

One prior art method that provides for simultaneous lead soldering is the "flip-chip" method developed by IBM, in which a lump of solder is placed on the chip and the chip is soldered to a ceramic substrate that is attached to the leads. This IBM method does not have a layer of leads on the top of the chip.

DISCLOSURE OF INVENTION

The invention relates to an automated method of assembling and encapsulating integrated circuit chips in which the chips have standard connections that are in the same position for a number of different models of chips; the leads are all attached at the same time (by a fusible alloy reflow bonding method); the leadframe is stamped from an inexpensive metal, such as copper, and the integrated circuit die is not attached to a support in an intermediate step.

A feature of the invention is the assembly of integrated circuits by a method in which all leads are attached simultaneously, so that the speed of assembly does not depend on the number of pins.

Another feature of the invention is the provision of a standard pad array used for different chips having the same number of pins, so that only one type of leadframe need be kept in inventory for each pin-family.

Yet another feature of the invention is the provision of a leadframe adapted for reliable formation of bonds simultaneously in an automatic process.

Yet another feature of the invention is an automatic method of removing chips selectively from a wafer using stored data to locate good chips.

Yet another feature of the invention is the elimination of an intermediate step of bonding a die to a support before lead attachment.

Yet another feature of the invention is the elimination of the need to control thermal expansion between the chip support and the chip.

Yet another feature of the invention is the provision of corrosion protection of the semiconductor metallization by a thick dielectric.

Yet another feature of the invention is the use of a single array of probe electrodes for testing a pin-count family of chips.

Yet another feature of the invention is the elimination of the step of thinning the wafer by lapping the back side.

BRIEF DESCRIPTION OF DRAWINGS

FIGS. 14A–B illustrate an alternate embodiment of part of the apparatus of FIG. 13.

FIGS. 15A–B illustrate an alternate embodiment of part of the apparatus of FIG. 13.

BEST MODE FOR CARRYING OUT THE INVENTION

Figure 1:
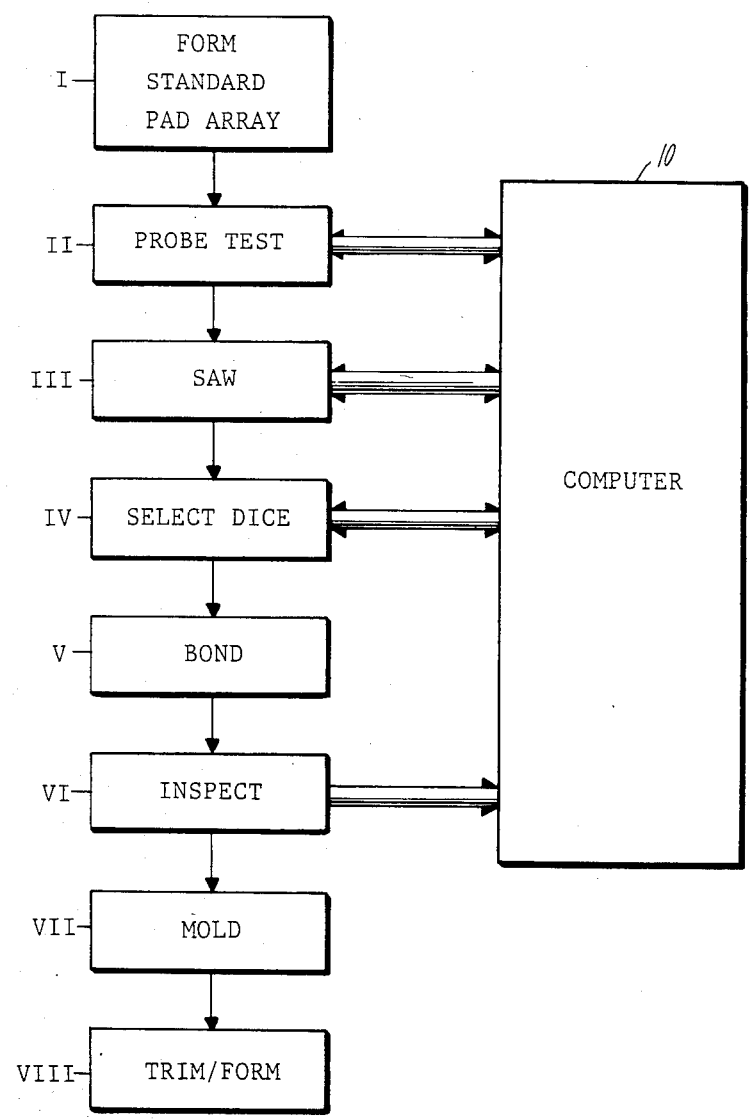
FIG. 1 illustrates the process flow in the subject invention.

An overall flow chart of the steps used in the back-end assembly is illustrated in FIG. 1, in which a number of steps are illustrated schematically and are performed by a variety of different machines in communication with and sometimes controlled by a computer for storing test and other data.

In the first major step, represented by the box labelled I, a process that may be part of the "front-end" or the "back-end", accepts as input a wafer that has been completed with all the conventional steps (including passivation—etc.) and applies a further layer of dielectric having a thickness sufficient to protect the chip circuits and to insulate them electrically from signals being carried on the top surface of the dielectric.

A pattern of metal leads is formed that extends from the contact pads on the previous chip to a standard array of contact pads on the top of the dielectric. The standard array is the same for all chips having the same number of pins, regardless of the size of the chip die.

The wafer is then probe tested, in major step II with the results of the probe test being stored electrically, such as in a computer. The conventional ink-dot marking system for bad chips is not used.

The wafer is then adhesively mounted on an adhesive film in a frame holder that is shaped to allow for automatic insertion and orientation in various fixtures further along in the process and cut apart in an automatic sawing process (Step III) that cuts through the entire thickness of the wafer.

The good dice are then removed from the wafer in an automatic sequence (Step IV) that presses from above against the tape to selectively pick a die down into a dedicated carrier where it rests circuit side down. This is not a problem since the active circuitry is protected by the standard pad dielectric and standard pads. The wafer and punch-out device are moved under computer control to put the dice into the correct positions in the carrier.

The dice are transferred to a mating carrier simultaneously in an inversion operation that rotates the two-carrier "sandwich" by 180 degrees, so that the dice resting in the second carrier have contacts on the top side. A set of dice are transferred to a bonding fixture that holds a convenient number, illustratively 14 dice. Once loading is complete, a leadframe matching the spacing of the dice in the fixture is positioned above the dice in the soldering fixture and an upper bonding fixture is added to maintain lead to pad contact during the bonding process.

The bonding fixture is heated to reflow the solder and form the interconnection (Step V).

The leadframe with dice attached is placed in a transfer or injection molding machine that encapsulates the die together with the interconnections to the leadframe (Step VII).

The molded strip of devices is then trimmed and formed conventionally (Step VIII).

There is a representation in FIG. 1 of data communication between the machines that perform the steps listed above and the controlling computer. Most data communication steps are optional. The step may indeed be performed under operator control and data may be written down manually. The benefits of automatic recording of data and error-free recall of data from a previous step will be evident to those skilled in the art.

The different steps of the invention are set forth in more detail below and in copending patent applications filed on the same date herewith and assigned to the assignee hereof.

Figure 2:
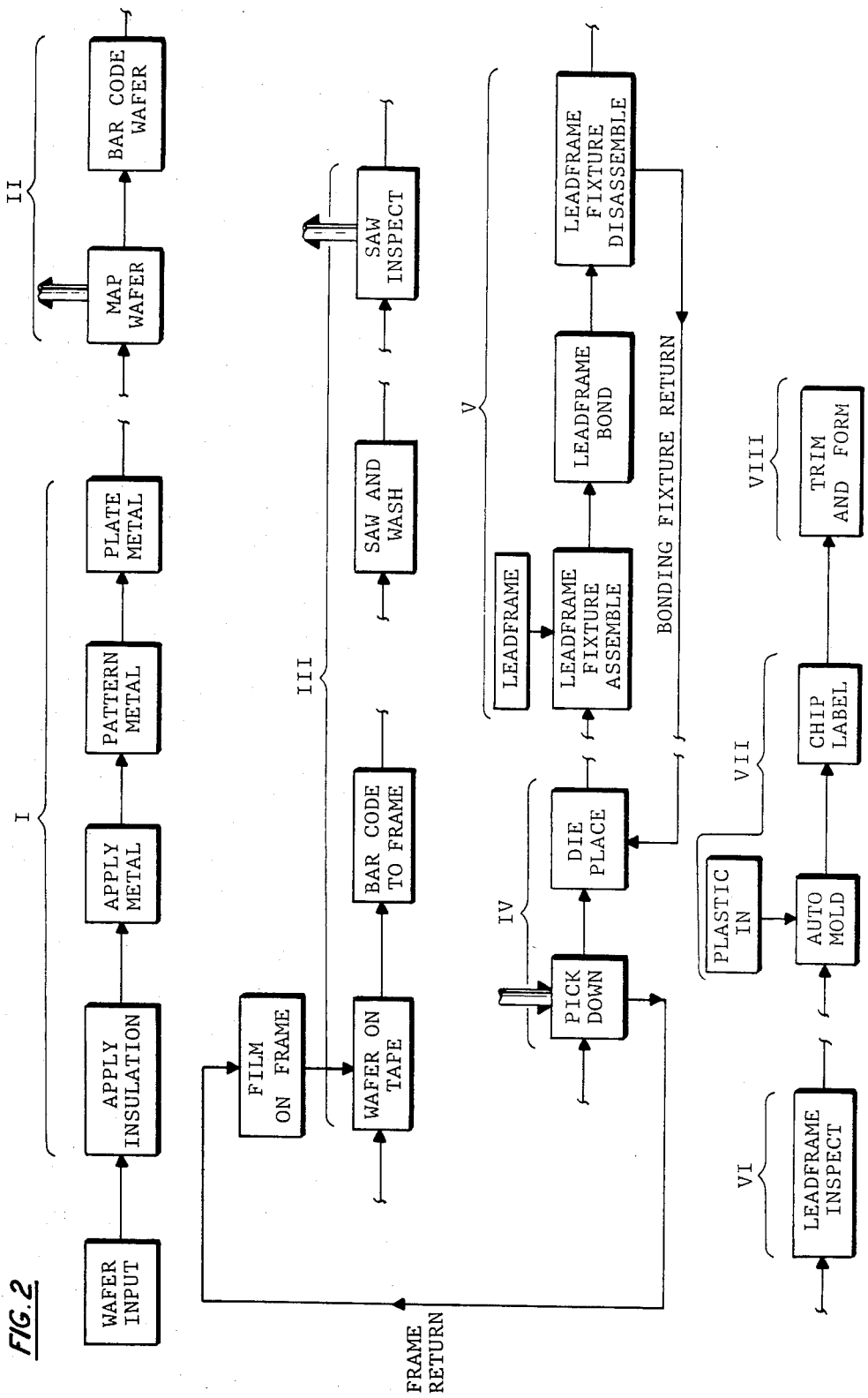
FIG. 2 illustrates the steps in FIG. 1 in more detail.

FIG. 2 sets out the steps in FIG. 1 in more detail and also illustrates the material and data flow. A convention used in this figure is that a broken line indicates a material transport step of the sort of loading the material into a container and moving the container to another location and a double arrow indicates data flow into or out of a computer or other storage device. The three material inputs to the process are the wafers, leadframes and plastic for encapsulation. Two recirculation loops involve, respectively, a frame used to support the wafers during the sawing and die selection steps and a positioning fixture used to maintain a set of dice in alignment with a leadframe segment during the bonding operation.

STANDARD CONTACT PADS

Returning to the first major step, the illustrative dielectric layer is a polyimide such as Dupont 2525 applied with the thickness of 6 microns and cured at a temperature of greater than 260 C. There may be a nitride or other layer below the polyimide to improve adhesion to the reflow glass or other top layer. The electrical contact pads that have been previously formed in the integrated circuit chip by conventional processing techniques are exposed by applying a photoresist, either liquid or in the form of a tape, on top of the dielectric and etching down through it a passageway to the metal contact pad in the circuit in a conventional manner. A "via" will be formed by filling the contact holes with a metal or other conductor until the surface of the dielectric is reached. The photoresist is stripped off and a layer of metal is applied by any technique, such as sputtering, over the surface of the polyimide. In one example, the polyimide was back sputtered to prepare the surface, after which 600 Angstroms of 10% titanium +90% tungsten followed by 1000 Angstroms of copper and the titanium tungston mixture sputtered simultaneously, followed by typically 3 microns of copper were sputtered on. A second layer of photoresist is applied and patterned to define a set of metal leads in the metal layer. The leads reach from the vias penetrating the dielectric to an area in the center of the chip which has a standard pad array of pad contacts that is the same for all the chips that have the same number of leads. For example, a 16 pin chip will have the same standard pad array, of size about 0.016" by 0.016" in a standard configuration having dimensions of 0.126" by 0.126", whether it is a memory or any other logic device. The standard pad array will be sized so that it fits on the smallest chip that is to be used with that leadframe. Optional versions of the invention employ a pad array that is arranged for some particular purpose.

The exposed areas of the metal are plated with a solder composed of a standard mixture of lead and tin in a conventional electrolytic plating process that employs a mixture of 95% tin and 5% lead. The photoresist is stripped and the plated areas of the metal layer are used as an etching mask in the next step in which the remaining unwanted area of the metal layer is etched away in a batch of hydrogen peroxide plus ammonium hydroxide followed by hydrogen peroxide, which does not attack the solder.

Figure 3A:
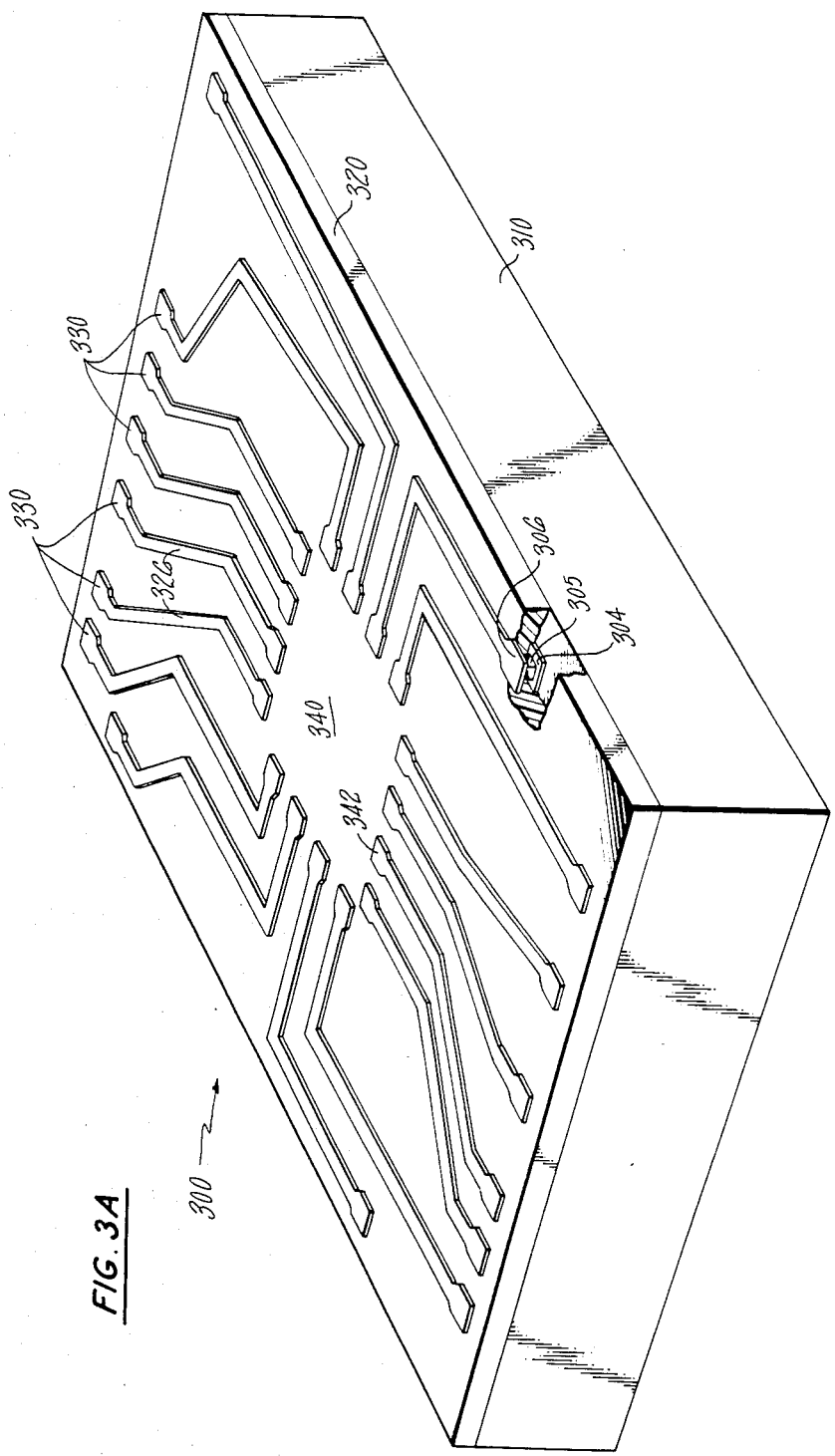
FIGS. 3A through 3D illustrate different forms of a chip used in the subject invention.

There now remains a chip 300 of the form illustrated in FIG. 3A, in which die 310 has on it a thick layer of polyimide 320 and a network of metal lines 326 leading from the contact areas 330 on the outside of the chip to the standard pad array 340. The metal lines 326 have lower inductance greater thermal conductivity and greater strength compared to the wires that were previously used.

In the example shown in FIG. 3A, the first contacts and the vias through the polyimide layer are all formed on the perimeter of the chip. This figure illustrates a chip in which the layout design was made for the old wire-bonding method in which the contact areas had to be on the perimeter of the chip. An advantage of retaining the old design, besides saving the expense of a new layout, is that it is possible to use conventional wire-bonding processes when added capacity is required. To do this however, requires that the additional dielectric and metallizations for the standard pad process is not used.

Figure 3B:
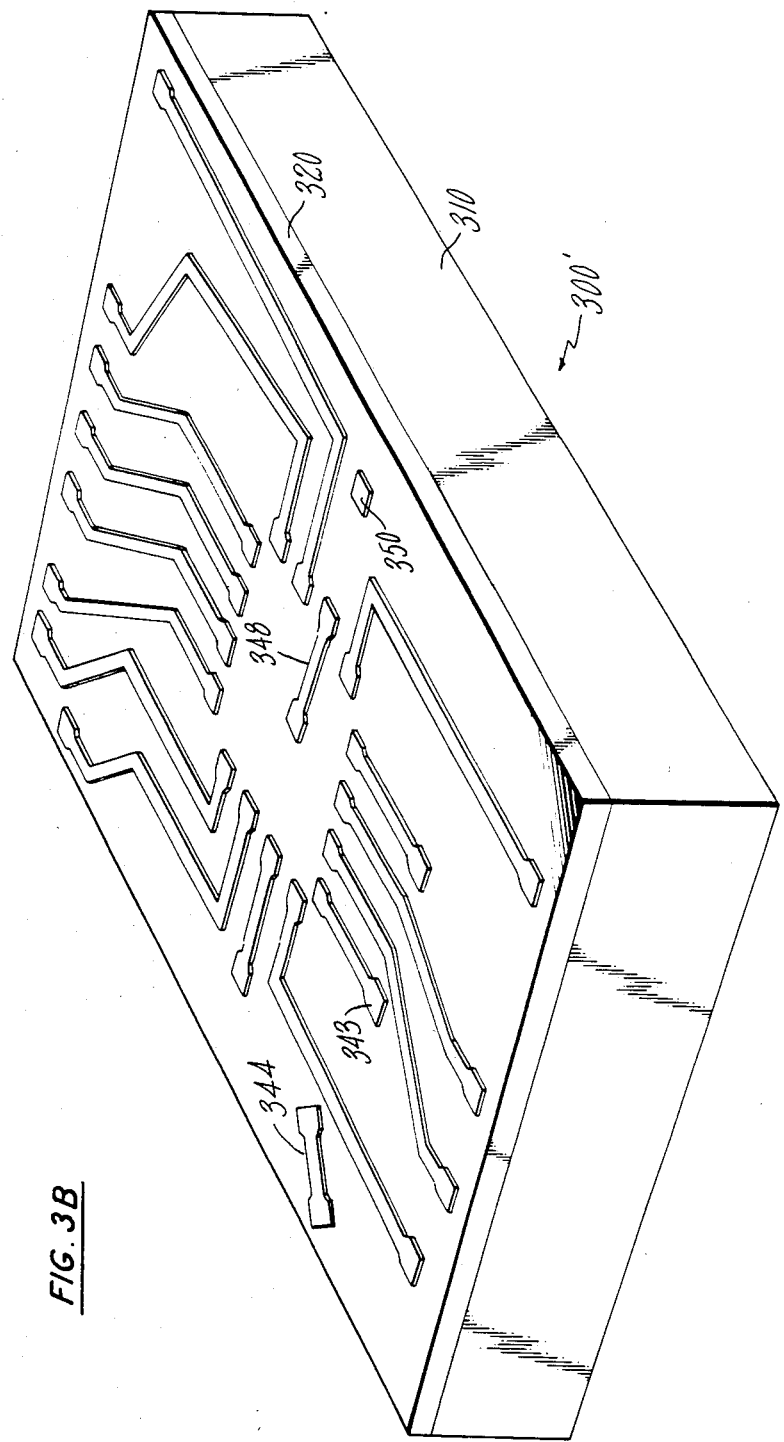

It is also possible to use the invention and put the contact areas through the dielectric at any convenient location, as shown in FIG. 3B. The vias for these leads are shown as originating at different locations on the chip surface, not exclusively at the edge as was the case in the prior art. Lead 348 is shown as connecting a via that is located within the standard pad array. Lead 343 is connected to a via-section 344 through a bridge, not shown in the drawing, that is placed on top of the passivation layer of the underlying chip below the polyimide. This illustrates an additional degree of freedom in routing leads and placing components that is provided by the invention.

A via 305 is shown in FIG. 3A in a cut-away portion of the figure as extending from a lower contact area 304 to an upper contact 306 at an end of one of leads 326. The lower contact pads in current practice are typically 4 mils by 4 mils. With such a large area to make contact, the alignment tolerance for the formation and location of the vias and the placement of leads 326 are typically $\pm 2$ mils to 3 mils, which is much greater than a typical tolerance of $\pm \frac{1}{2}$ mil to 1 mil for connecting leads in the precision processes that are used with conventional wirebonding.

The steps of forming vias and putting down leads may be performed in the front-end using the standard machines for photolithography, if that is convenient. Since the requirements for putting down these metal leads are much less stringent in position alignment than the usual front-end work, it may be preferable to use thick-film technology, such as screen printing, to pattern the dielectric and top leads. Typically, the thick-film technique will be $\frac{1}{4}$ to $\frac{1}{2}$ the cost of the precision techniques.

Figure 20:
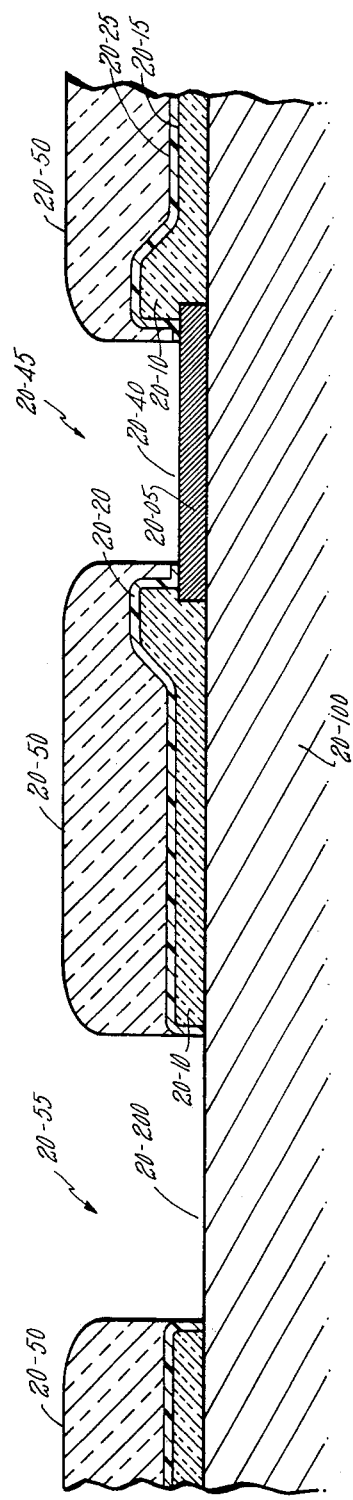
FIG. 20 illustrates a cross section of a die used in the invention.

It has been found that the polyimide layer 302 of FIG. 3A does not adhere reliably if it is attached directly to the layer of oxide immediately below it. A cross section of a portion of a die is shown in FIG. 20, in which substrate 20-100 is the silicon substrate and aperture 20-200 is the "street" that separates adjacent dice. The width of a street is typically 100 microns, to allow room for the saw kerf in the separation step that is performed with a diamond saw having a width of 0.001 inch.

A contact pad, 20-05, is shown with a series of apertures defined above it. Pad 20-05, which is typically aluminum and is connected by metallization strips, not shown, to the rest of the circuit, is surrounded by oxide 20-10, which has a conventional composition of $SiO_2$ plus phosphorous and other additives and a thickness of 1 micron. Oxide 20-10 has a top surface 20-15 on which polyimide layer 20-50 was, at first, applied directly. Early tests showed significant difficulty, in that polyimide layer 20-50 (layer 320 in FIG. 3A) often disbonded, causing the leadframe to pull the polyimide away from the underlying layer.

Oxide 20-10 functions as the top dielectric layer in the circuit. It not only coats the substrate and contacts, as shown in FIG. 20, but also the circuit elements and metallization.

Passivation of the active elements of the circuit is effected in the usual manner of silicon MOSFETS by the thin oxide over source, drain and active area so that oxide 20-10 functions purely as a dielectric, not as a passivating layer.

Nitride layer 20-20 is deposited by plasma-assisted CVD at a temperature of 250° C., in a conventional manner, to a thickness of 0.3 micron after street 20-200 has been etched through oxide 20-10 to the substrate. A layer of 2525 polyimide from Dupont is applied and spun to produce a relatively flat top surface. Apertures 20-45 above contact 20-05 and 20-55 above street 20-200 are opened through the uncured polyimide by wet etching with a conventional basic solution such as Shipley 312 developer. Typical dimensions for the top of aperture 20-55 and 20-45 are 100 and 87 microns, respectively. After aperture 20-45 has been opened, aperture 20-40 is opened through nitride layer 20-20 by plasma etching in CF4. A typical dimension of aperture 20-40 is 75 microns, so that aperture 20-40 is surrounded by nitride 20-20 and does not expose any of oxide 20-10.

It has been found that the adhesion of polyimide to top surface 20-25 of nitride 20-20 is greatly improved over the adhesion of polymide to oxide 20-10 at surface 20-15. Nitride 20-20 adheres well to oxide at surface 20-15. The function of nitride 20-20 is thus to improve the adhesion of the polymide by means of a structure that totally encloses the oxide 20-10, not only at the vias but also at the saw cuts on the streets.

PROBE TEST the next major step II is a test with the individual circuit dice still remaining in the wafer. A conventional wafer electrical test step could be performed in which small probes are attached to the contacts that will be used for the input/output and the individual chips are tested. An advantage of this invention is that the metal leads on top of the polyimide cover a much larger area than the old-style contact pads do, so that it is easier to make electrical contact at reduced pressure of the electrical contact probe or electrode with these large metal pads than it is with the small contact pads used in conventional techniques. It is also possible to make electrical contact to the leads before you reach the contact area, thus providing additional flexibility in the probe step. An important economic benefit from the invention is that only a single set of probe tips will be needed to match the standard pad array for the whole family of circuits that have the same number of pins. In the prior art, a different set of probe tips was typically needed for each chip design.

If the chip has optional electric contact pads outside the standard pad array, as shown by contact 350 in FIG. 3B (which is a via formed to provide access to a point in a circuit that is to be tested, yet does not connect to one of the regular contacts), then a different set of probe pins will be needed in that case, of course.

In conventional wafer tests, defective chips are marked by a small dot of ink so that, in manual assembly, they can be identified and discarded. In this process, the chips are identified electrically—i.e. the wafer is oriented in a particular way and the chips are identified by their locations in an X-Y matrix. The test data for individual chips are stored in the central computer memory or in a floppy disk or other storage medium and defective chips are identified in the computer. This step is referred to in FIG. 2 as wafer mapping.

If the chip has the feature of redundant or optional circuits that are connected or disconnected by blowing fuses by a laser (as is done in large scale memory arrays), then this step will have been done before the polyimide layer is put down, as is currently being done. It is possible, however, to provide for the enabling or disabling of optional subcircuits or the enabling of redundant circuits to be done electrically by means of access through additional contacts (similar to contact 350) that are placed through the polyimide layer outside of the metal strips, or by putting down the polyimide with a large opening over the redundant circuits that will be closed later. In that case, the central computer would identify optional circuits that are to be enabled or disabled and blow fuses appropriately through the test probes. The point in the sequence at which fuse-blowing is to be done is optional, of course.

If the wafers have not been given an identifying label before, it is now necessary to put a label on them in order to maintain the connection between the test data stored in the computer and the wafer the data came from. There are many ways of doing this correlation, of course, and no particular method is required. One preferred method is to put the identification on an identifying label, such as an optical bar code, that identifies the wafer. Another method is to form a programmable memory in the wafer in which the identities of defective chips may be stored. In that case, the wafer carries with it the necessary information so that there is no problem of getting the wafer separated from the test results.

SAW

Figure 4:
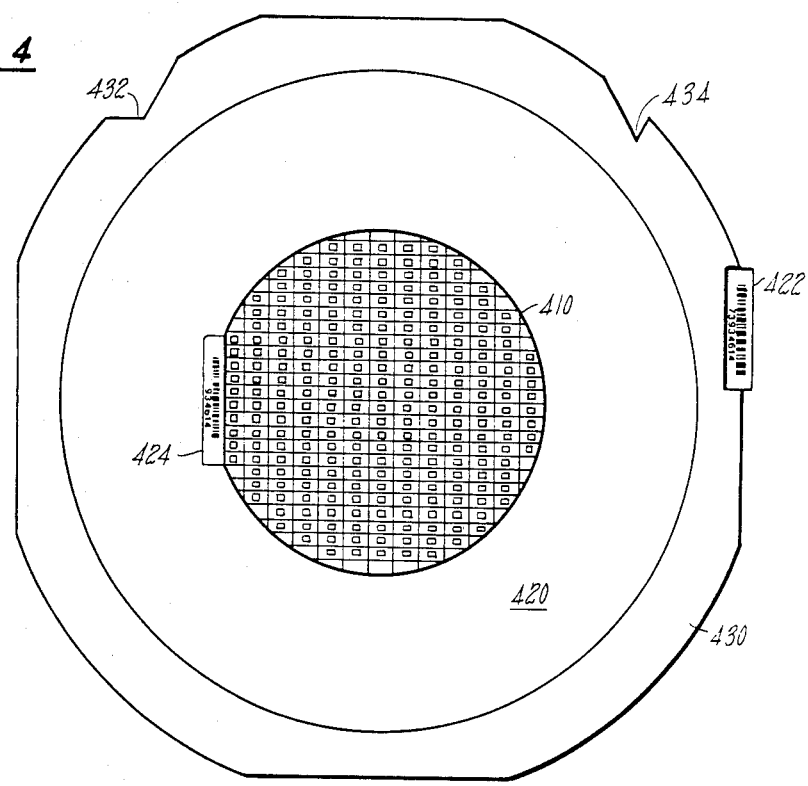
FIG. 4 illustrates a wafer mounted on tape.

In the next major stage of the process (Step III), the wafers are accurately mounted in a fixture and the dice are cut apart. Referring now to FIG. 4, wafer 410 is accurately mounted on an adhesive tape 420 that has been stretched over a frame 430. Since the dice on a wafer are positioned in a rectangular array, a simple reference system is all that is necessary is a pair of detents 432 and 434 that define a reference direction. The wafer is positioned so that a reference point on the wafer is positioned with a known relation to detent 432, say, in a coordinate system aligned with respect to the detents. The point in the sequence for establishing the coordinate system is also optional. At this time, an identifying label on the frame is correlated with the identifying number on the wafer. This may be done by applying a new label to the frame that matches the wafer label; or by reading a permanent label on the frame.

A conventional automatic saw cuts entirely through wafer 410 along the "streets" that separate the dice. This is in contrast to the prior art, in which the wafer is cut partially through ("scribed") and the dice are broken apart. In a method according to the invention, the dice remain in their positions during the separation process, in contrast to the prior art, in which the identity of the dice is typically lost when they are broken apart and processed. Since the identity of the dice is preserved, it is possible with this invention to track an individual die through the manufacturing process.

In an optional method, the saw has the ability to detect damage done to chips during the sawing process and the test data stored in the computer can be updated to identify damaged chips. A saw with the optional damage-identification feature is a K&S Model 797. The wafers are conventionally cleaned by cleaning equipment that is integral with the saw system.

SELECT DICE

Figure 7A:
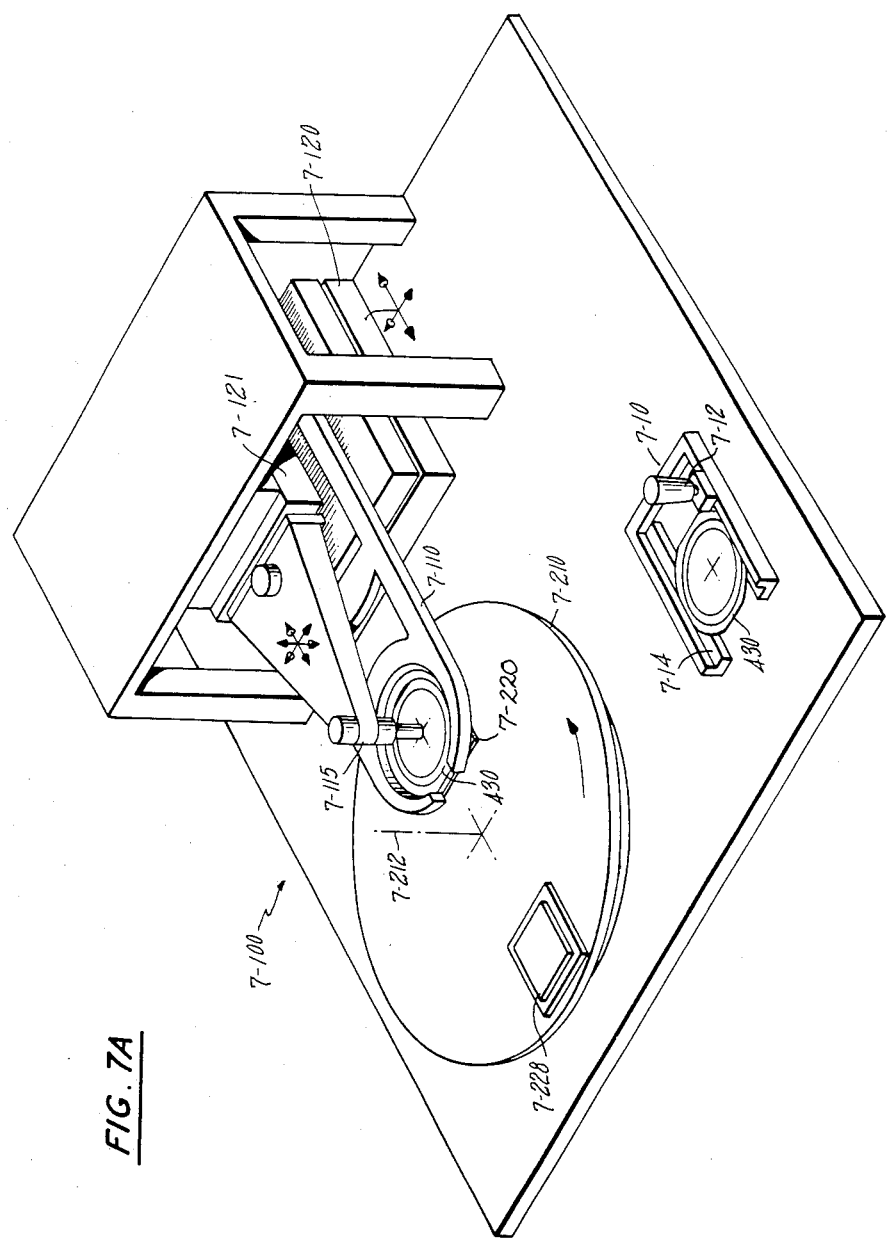
FIGS. 7A–7C illustrate a layout for a machine used for pick-down die selection from a sawn wafer into a die storage carrier.

Referring now to FIG. 7A, there is illustrated an apparatus used to implement the sorting process of picking out the good dice or dice with desired performance levels. More detail of the process steps is shown in FIG. 2, which shows steps that are part of major steps III, IV and V. Referring now to FIG. 2, an optional inspection step that may be considered part of major step III or IV inspects the sawn wafer and updates the "wafer map" if any dice have been damaged in the sawing process. The device is commercially available and is part of the saw work station. The washed wafers are then transferred to a work station to be described below, where the wafer identifying label is read, then to the picking station where the stored data is related to the aligned wafer. An optional inspection step that may be considered part of major step III or IV inspects the sawn wafer and updates the "wafer map" if any dice have been damaged in the sawing process. The device is commercially available.

The die selection process is discussed in more detail in connection with FIG. 6. During this sequence, tape frames are cycled in a recirculation loop, indicated by a reverse line in FIG. 2. When the supply of usable dice from a wafer is exhausted, the frame is moved to a station where the old tape and scrap dice are removed and the empty frames are brought back to the input station.

Figure 7B:
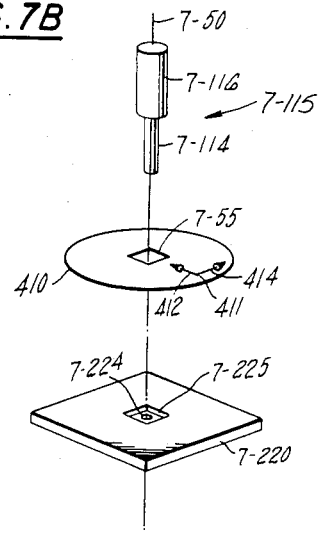

Referring now to FIGS. 7A and 7B, a rotary indexer 7-210, illustratively rotating under computer control, holds a set of die holders, two of which are shown as 7-220 and 7-228. A convention used in this specification is that the first number of a hyphenated reference numeral refers to the figure in which the item is introduced or explained in most detail. Each die holder (referred to as a "waffle pack" because of its appearance) receives dice into a rectangular array of receptacles as they fall away from a wafer 410 in a process that is described more fully below.

When a waffle pack is filled, indexer 7-210 rotates an empty pack into position. The full pack is rotated into an unloading position and passed to an inversion station where a matching waffle pack is aligned on top of the dice and the waffle pack plus dice "sandwich" is inverted so that the dice are resting with the contact side upwards ready to be placed in a bonding fixture. This inversion step may be performed manually or automatically. Optional forms of inversion are described below.

A tape frame is first identified in bar code reader station 7-10 in FIG. 7A, in a sequence (6-114 in FIG. 6) in which tape frame 430 rests on shelves 7-14 and either the frame is moved or reader 7-12 is slid over the label. A conventional bar code reading system reads the code and transmits it to the computer, where the data from the test results are fetched from memory (steps 6-200) to guide the die-selection process.

Further details of the selection process and apparatus are illustrated in FIG. 7B, in which axis 7-50 passes through assembly 7-115 comprising energizer 7-116 and striker 7-114 above die 7-55 which is part of wafer 410.

Wafer 410, as described above is, in the discussion of FIG. 4, adheres to tape 420 held in frame 430, which is mounted with wafer 410 on the lower side. Die 7-55 is the next die to be removed from the die array that was formed on wafer 410. Frame 430 is supported by holder 7-110 and positioned at axis 7-50 by X-Y drive 7-120, shown in schematic form in FIG. 7A, as it is a conventional device (Kulicke & Soffa Model 350-103). Frame 430 is aligned in position, as described in the discussion of FIG. 4, by the matching of detents 432 and 434 with pins in holder 7-110. Unnecessary details of the apparatus have been omitted in order to show the essential relationship with the greatest clarity.

Below die 7-55, receptacle 7-225, formed in holder 7-220 awaits the die. Holder 7-220 is one of two or more holders (7-220, and 7-228) resting on plate 7-210.

Figure 7C:
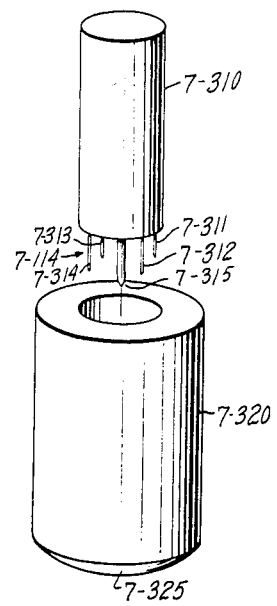

In operation, the striking assembly 7-115 presses striker 7-114 against the top of tape 420, deflecting it downward by approximately one quarter inch. X-Y drive 7-121 slides striker 7-114 over the tape to the correct position. The pick-down operation is effected by air valve 7-116 (one version of the energizer) which is energized to drive striker 7-114 downwards, striking tape 420 at a point above die 7-55. Die 7-55 is gently pushed from the adhesive tape and falls into receptacle 7-225. Pin assembly 7-114 penetrates tape 420 with a set of needles shown in FIG. 7C. Four needles, 7-311, to 7-314 are rigidly attached to shaft 7-310. A fifth needle 7-315 extends 0.050 inch below the others and is spring-loaded with a force of three ounces.

Illustratively, assembly 7-114 is projected downward by a conventional two-way air valve 7-116 with a force of one pound, the air pressure being on for a period of about 20 milliseconds. Needle assembly 7-114 is retracted when its travel has triggered an optical limit switch that is set so that the tips of needles 7-311 to 7-314 project about $\frac{1}{8}$ inch below lower surface 7-325 of holder 7-320. Lower surface 7-325 has a radius of curvature of two inches to avoid excessive stress on the dice.

An important function of needle 7-315 is to suppress bouncing of the die. The die falls a nominal distance of 3/16 inch to receptacle 7-225. It may bounce partially out of the receptacle in extreme cases; it may lie against a side; or it may be chipped by impact with the bottom or sides of the receptacle. The spring on needle 7-315 absorbs the kinetic energy of the die, so that it quickly comes to rest with the minimum number of impacts.

Assembly 7-114 may advantageously be fitted with a conventional quick release mounting to facilitate rapid change from one assembly having a needle spacing suited for a large die to another assembly having a different spacing for a different die. Receptacle 7-225 in FIG. 7B is shown in the figure as a recessed rectangle, but other forms will be evident to those skilled in the art. A slight vacuum can be used to maintain the die in the interior of holder 7-220, communicating with the interior of receptacle 7-225 through hole 7-224 in FIG. 7B, so that die 7-55 is further prevented from bouncing out of alignment. The vacuum within holder 7-220 is maintained by forming a wiping seal at the lower surface of plate 7-210. As the plate rotates, an aperture in plate 7-210 comes to rest over a fixed vacuum line that is not shown in the drawing. The aperture establishes communication between the interior of holder 7-220 and the vacuum.

When holder 7-220 is full, or when a different performance level of die is to be selected, the drive within plate 7-210 rotates plate 7-210 to position the next holder. Holder 7-220 may be removed and passed to the next stage or remain stationary to accept additional dice of the same performance level, to be selected from a different wafer.

The assemblage of the two X-Y drives 7-120 and 7-121 and holders, indicated generally by the numeral 7-100, is a commercially available item from Design Components Inc., Medford, Mass., Model Numbers DC44 and DC88, modified to hold the driving pin 7-115 and frame holder 7-110. The device 7-100 operates under the control of a computer, either the central computer indicated in FIG. 1 or a small local computer. The essential information that must be handled is the position of the current empty receptacle 7-225, the position of the next good die 7-55 relative to the coordinates centered at point 411 and the position of point 411 relative to holder 7-220. Axis 7-50 is, of course, centered on the receptacle 7-225 next to be filled and pin 7-315 and the next to be removed die are positioned accordingly.

Figure 6:
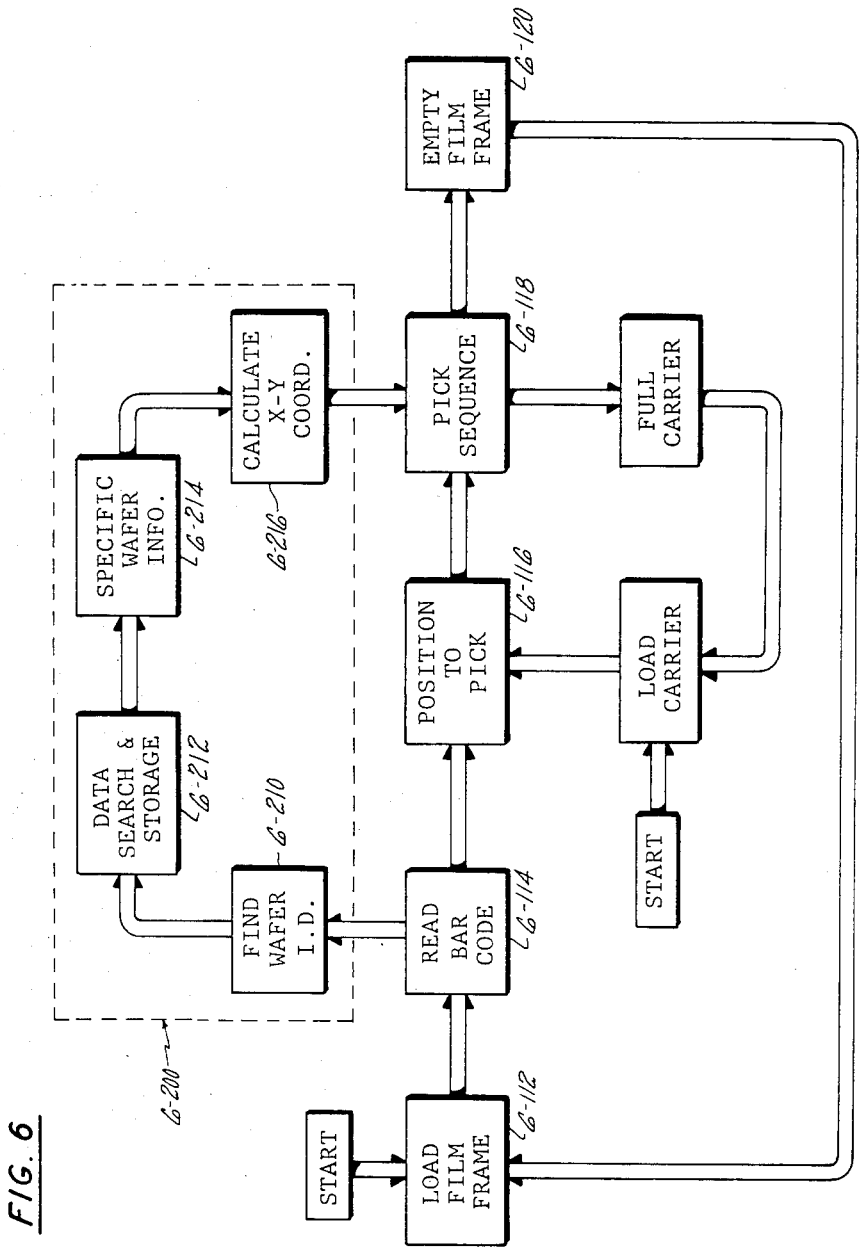
FIG. 6 illustrates a sequence of selecting the die from a sawn wafer.

The sequence to be followed in knocking out good dice is indicated in FIG. 6, in which a tape-frame is loaded manually or by robot (6-112) to start the process; the identifying bar code on the frame is read in step 6-114. The frame number is read and sent to a computer or stored in memory and compared against the data for the numbered or coded wafer. The exact X-Y position or wafer map for all good or selected die on the wafer is known and associated with the frame number allowing good die to be selected. The information stored in the computer is searched in sequence 6-200, in which the result at step 6-216 is the X-Y coordinate of the first (next) good die. A parallel sequence starts with loading an empty carrier 7-220 and rotating table 7-210 to position it close to device 7-100. This computer control may be done with a general-purpose computer or with dedicated hardware. In either case, it is referred to as stored program and/or memory control. The pick sequence, (sometimes referred to as "pick-down" in contrast to a conventional "pick-up") is represented in step 6-118.

The pick-down sequence is repeated until the first to occur of the depletion of the good dice that were on wafer 410 and are now in an array on tape 420 and the filling of carrier 7-220. In either case, a new tape carrier or dice holder is substituted and the sequence is restarted. In an alternate sequence, only dice having certain criteria are selected in one pass and other good dice that are usable for a different application are left to be selected later.

While positioned in tape 420, the dice have their contacts facing down toward holder 7-220. It is necessary to invert the dice, so that when a die is placed in contact with a leadframe, the standard pads touch the leadframe; and this is done in the next step. The inversion may be manual, or may be carried out by machine, either singly or in groups.

SINGLE INVERSION

Figure 8A:
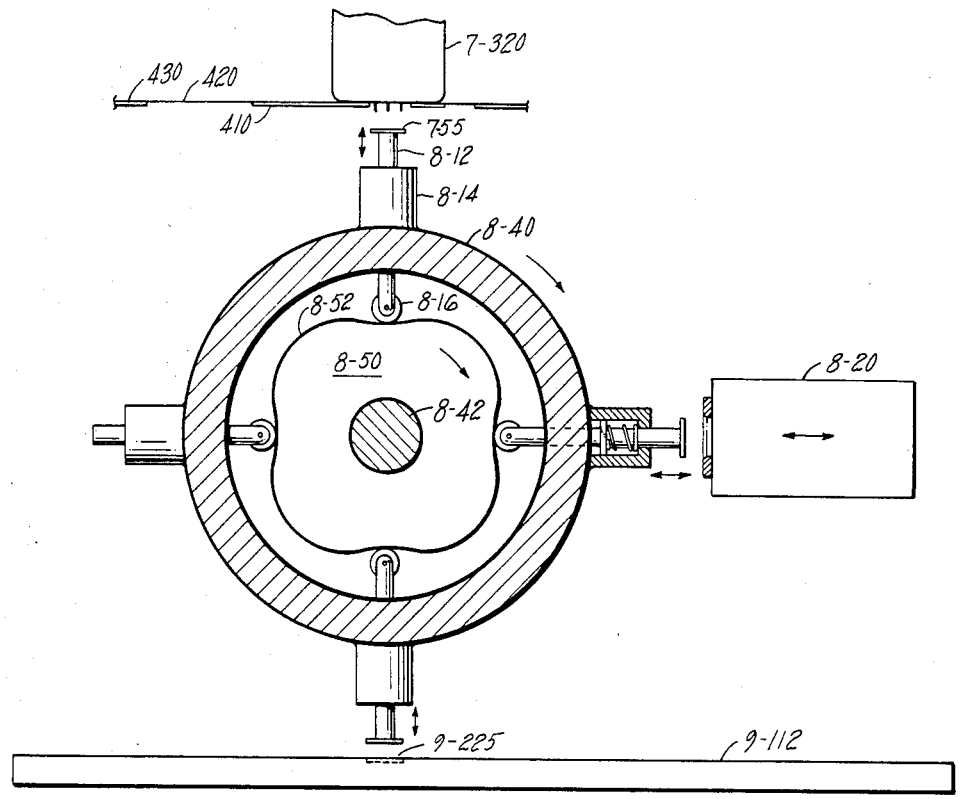
FIGS. 8A–8C illustrate an apparatus for an intermediate inversion step in the operating sequence of the apparatus used in FIG. 7.

An apparatus for performing the inversion step one die at a time is illustrated in FIG. 8A, in which die 7-55 is knocked off wafer 410 by needles 7-312 to 7-315 in head 7-320 as before. Instead of falling directly into receptacle 9-225 in holder 9-112, however, the die falls a short distance onto tube 8-12 extending upward from housing 8-14 supported by rotating cylinder 8-40. The die is held by vacuum action, the vacuum being maintained and switched by conventional means not shown in the drawing. Tube 8-12 moves up and down as indicated by the arrows in response to cams 8-52 on cam cylinder 8-50 rotating about axis 8-42, co-axial with cylinder 8-40. Cam cylinder 8-50 may rotate with cylinder 8-40 or rotate independently of it, under the control of conventional means not shown.

In operation, a new die is moved into position, nominally centered on tube 8-12, but actually somewhat misaligned because of error in the placement of wafer 410 on tape 420, as well as errors in aligning the supporting tape frame 430. Cam cylinder 8-50, rotates, bringing cam 8-52 into position under cam follower 8-16 and thus raising the tip of tube 8-12 into position to receive the die.

At the same time that the top tube 8-12 is receiving a die, the bottom tube 8-12 extends to deposit its die in receptacle 9-225.

Receptacle 9-225 will typically be only 0.002 inches greater in size than the die, in order to ensure accurate alignment of the leadframe with the die, so that the die will have to have its position corrected before it can enter. In FIG. 8A, this precising step is shown as being effected by preciser 8-20 which engages the die and, by conventional tapered surfaces, forces it into alignment. This precising step is performed at the same time as dice are deposited at the top and released at the bottom, so that no time is lost.

Figure 8B:
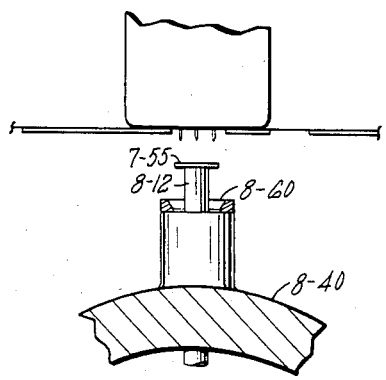

Those skilled in the art will recognize that a precising step may be performed at any of the three positions, or at more than one position. In particular, FIG. 8B shows a preciser 8-60 mounted on holder 8-14, so that the precising step is performed as tube 8-12 returns to a rest position. The vacuum may be turned off as tube 8-12 is lowered, in order to permit the die to slide into position more easily.

Yet another alternative is to have a preciser 8-60' mounted above receptacle 9-225. This preciser could be fixed in space and aligned with axis 8-42 of rotating cylinder 8-40; or it may be aligned with respect to fixture 9-112 (and removed before the leadframe is deposited).

Those skilled in the art will recognize that many alternative apparatus will be able to perform the inversion function. For example, cam cylinder 8-50 may be replaced by hydraulic cylinders, screw drives or any other means for advancing and retracting tubes 8-12. Further, if tape 420 and fixture 9-112 can be positioned with sufficient accuracy, then tubes 8-12 may be rigidly attached to cylinder 8-40, which will reduce alignment errors that result from tolerance in the position of tubes 8-12 relative to cylinder 8-40. In that case, any necessary vertical motion will be provided by holder 7-320 and/or holder 9-112.

MASS INVERSION

Figure 13A:
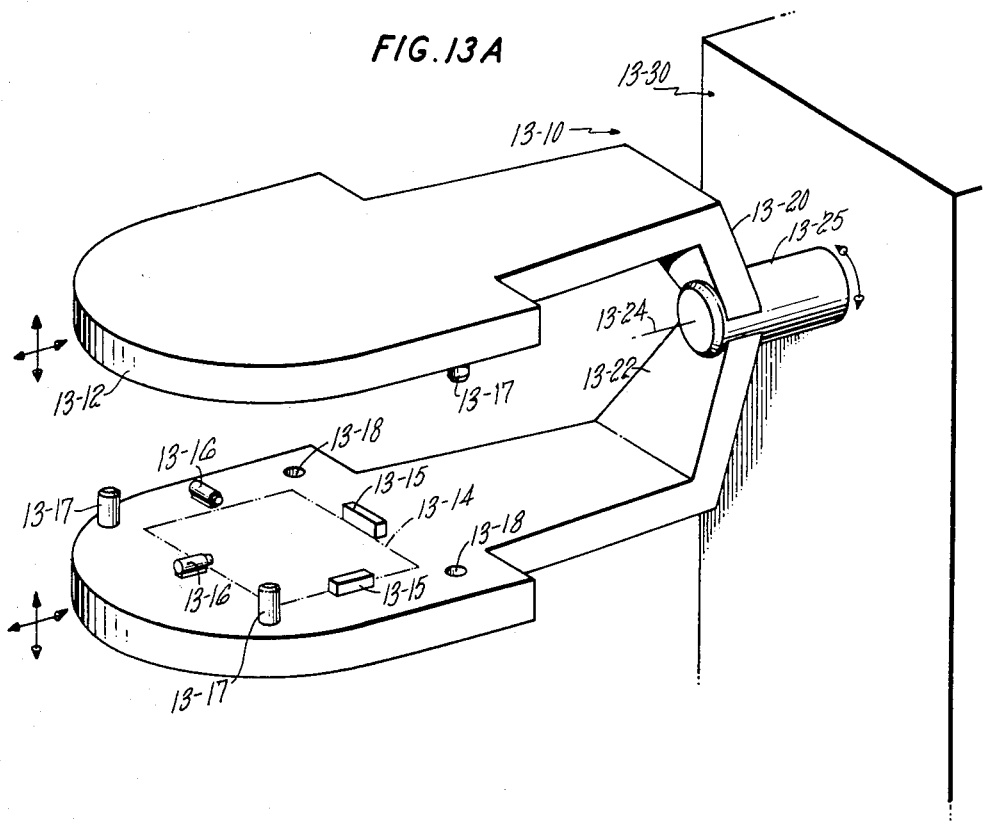
FIGS. 13A–B illustrate an alternative device for inverting dice.

A mass inversion step may be performed with the apparatus shown in FIG. 13A, in which two matching inversion plates 13-12 each hold a waffle pack 7-228. Only the lower plate 13-12 is shown, without the waffle pack, for greater clarity in exposition. Initially, a full waffle pack having dice with contacts facing down is placed in the dotted outline 13-14, aligned by stops 13-15 and held in place by compliant members 13-16, each of which is a spring loaded cylinder having a rounded tip. This mechanism is the same as that used in FIG. 7A and the robot gripper is the same.

The overall mechanism indicated by the numeral 13-10 includes holders 13-12 and conventional parallel-motion (parallelogram linkage) means 13-20, and 13-22, which are indicated schematically. These jaws move parallel to axis 13-24 of shaft 13-25 (activated by controller 13-30) from the open position shown in the figure to a closed position centered on the axis. The activating means may be a hydraulic cylinder or a motor. Alignment pins 13-17 and alignment holes 13-18 engage their opposites in the other inversion plate before the waffle packs mate. Optionally, the waffle packs may also have alignment pins for a fine alignment to compensate for position tolerance of members 13-15–13-16.

Once the inversion plates and waffle packs have engaged, assembly 13-10 rotates 180 degrees about axis 13-24 by turning shaft 13-25 under control of a rotating table within controller 13-30. The dice within the receptacles 7-225 of the filled waffle pack will have fallen into the empty one, aided by air pressure and vacuum lines carried within shaft 13-25. These lines will be switched by valves within controller 13-30 from an initial vacuum to hold the dice in the lower pack to a positive pressure to urge the dice into the other pack. Controller 13-30 is shown schematically in the figure as a box. It will comprise a rotating table or other conventional means for rotating shaft 13-25, together with air and vacuum valves as needed, all controlled by a microcomputer or by hand-wired logic. Those skilled in the art will readily be able to assemble many different controllers that will perform these simple functions and no particular form is required for the invention.

Figure 13B:
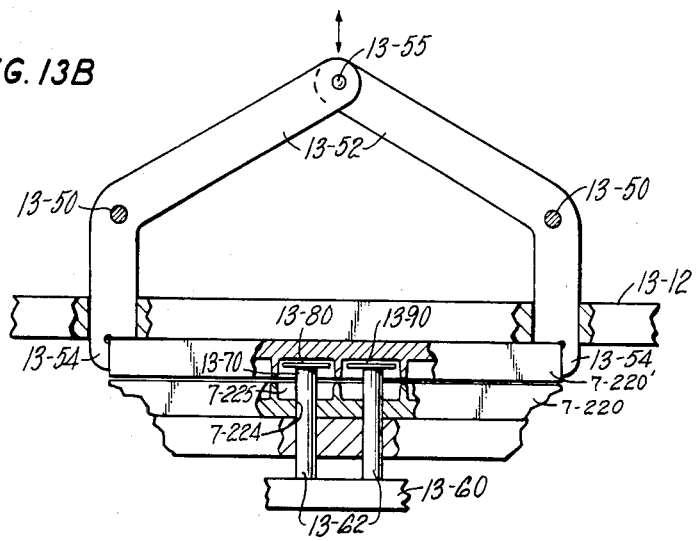

Alternatively, in order to avoid the possibility that a die will lean against one side of a receptacle in the waffle pack, the mechanism shown in cross section in FIG. 13B may be used, in which a portion of mating waffle packs 7-220 and 7-220' having apertures 7-225 with holes 7-224 further includes a frame 13-60 having pins 13-62 that pass through the apertures 7-224. Frame 13-60 is supported in the interior of plate 13-12. Pins 13-62 have top surfaces 13-70 that are wide enough to support chips 13-80. Before the rotation step, frame 13-60 is gently raised by air pressure, spring pressure or any convenient means to pass through holes 7-224 and then lift chips 13-80 almost to the bottom surfaces 13-90 of the receptacles 7-225 in mating waffle pack 7-220'. When the inversion step is performed, chips 13-80 will fall only a short distance, 0.05 inch say, so that the chips will be flat on surface 13-90 of receptacle 7-225.

In order to facilitate smooth operation, both waffle packs may be pivoted to compensate for mechanical misalignment, so that they mate properly. Gripper arms 13-52 pivoting about fixed pivots 13-50 terminate in gripping ends 13-54 that clamp the waffle pack 7-220'. Fixed pivots 13-50 are supported by a conventional means, such as a gymbal mount, not shown in the drawing for clarity. Movable pivot 13-55 joining both gripper arms 13-52 is moved by a hydraulic cylinder or other means as shown by the arrow to engage or disengage the waffle pack. A similar pivot may be used for waffle pack 7-220.

After the rotation, jaws 13-20 and 13-22 separate and the formerly empty pack containing dice with contacts facing up is removed, with the initially full pack remaining for the next inversion.

Those skilled in the art will readily be able to devise different embodiments of the invention in the light of this disclosure. For example, the inverter of FIG. 8A might have 14 receptacles in parallel, extending parallel to axis 8-42, and spaced to match the leadframe spacing, so that only one inversion step per leadframe set of dice is needed. The receptacles on top of such an inverter would be filled and then the complete set would be inverted into the waffle pack. The four tubes 8-12 of FIG. 8A may be replaced by any convenient number spaced about the circumference of cylinder 8-40.

FIGS. 14 and 15 illustrate two alternative devices for performing the inversion step with a full waffle-pack. In FIGS. 14A and 14B, an alternative device to that shown in FIG. 13A uses the same controller 13-30 that rotates shaft 13-25, but in which the two holders 13-12 are supported in a different manner.

Referring now to FIG. 14A, two holders 13-12 and 13-12' are shown, which move in the directions indicated by the arrows vertically, without horizontal motion. The motion is supplied by shaft 14-10 having two areas 14-11, 14-13, which are threaded in opposite directions, respectively. These threads engage mating threads in threaded blocks 14-09 and 14-09' which are part of the supports for holders 13-12. As shaft 14-10 rotates in one direction holders 13-12 separate so that the waffle-pack may be inserted or removed. Box 14-12 is a schematic representation of a reversible electric motor together with a worm-gear drive for supplying the rotating force to shaft 14-10. Box 14-12 is shown supported by shaft 13-25 which rotates as described above. Electric power is supplied to box 14-12 through the hollow interior of shaft 13-25. In FIG. 14B, a top view of support 13-12 is shown, showing guides 14-14 and 14-14', which serve to maintain holders 13-12 and 13-12' in alignment.

Referring now to FIGS. 15A and 15B, another alternative embodiment of the support and moving mechanism for holders 13-12 is shown. In this figure, only the upper plate has moved to provide clearance for insertion and removal of the waffle pack. Holder 13-12 is rotated about pivot 15-21. The rotating force is supplied by lever arm 15-20 connected by pivot 15-22 to cylinder assembly 15-24, comprising moving cylinder 15-28, paralleled by spring 15-25, and housing 15-26. Cylinder 15-24 pivots about pivot 15-30 that is aligned on axis 13-24. Lifting force is supplied by spring 15-25, which maintains holder 13-12 in a normally lifted position. When air pressure is applied to cylinder 15-28, it extends to expand spring 15-25 and force holder 13-12 down toward axis 13-24, to mate the two waffle packs. During the inversion step, the two plates 13-12 and 13-12' are maintained parallel with their respective waffle-packs 13-14 and 13-14' in alignment. At the end of the rotation step, the upper plate 13-12 is lifted, as indicated by the arrows, to permit the robot gripper arm to remove the bottom waffle pack. FIG. 15B shows a top view of this device. Cylinder 15-24 is the upper cylinder in this case and cylinder 15-24' is shown in a cutaway view. Air pressure for the two cylinders 15-24 and 15-24' is supplied along hoses passing through the interior of hollow shaft 13-25, as before. Controller 13-30 serves to open and close the holders and rotate the shaft, as described with respect to FIG. 13.

In all the embodiments that perform the inversion step with the waffle packs, there will be an additional pick and place step, shown as "Die Place" in FIG. 2, in which the upward-facing dice in holder 7-220' are removed and placed in a 14 chip holder, similar to 9-112, that has the chips positioned to align with a leadframe set for the bonding operation. This is a conventional pick and place operation, however, it is a parallel process operation in which one row of holder 7-220' is picked up simultaneously; placed in a preciser to secure the correct alignment; then placed in the bonding fixture with the correct alignment.

Figure 16:
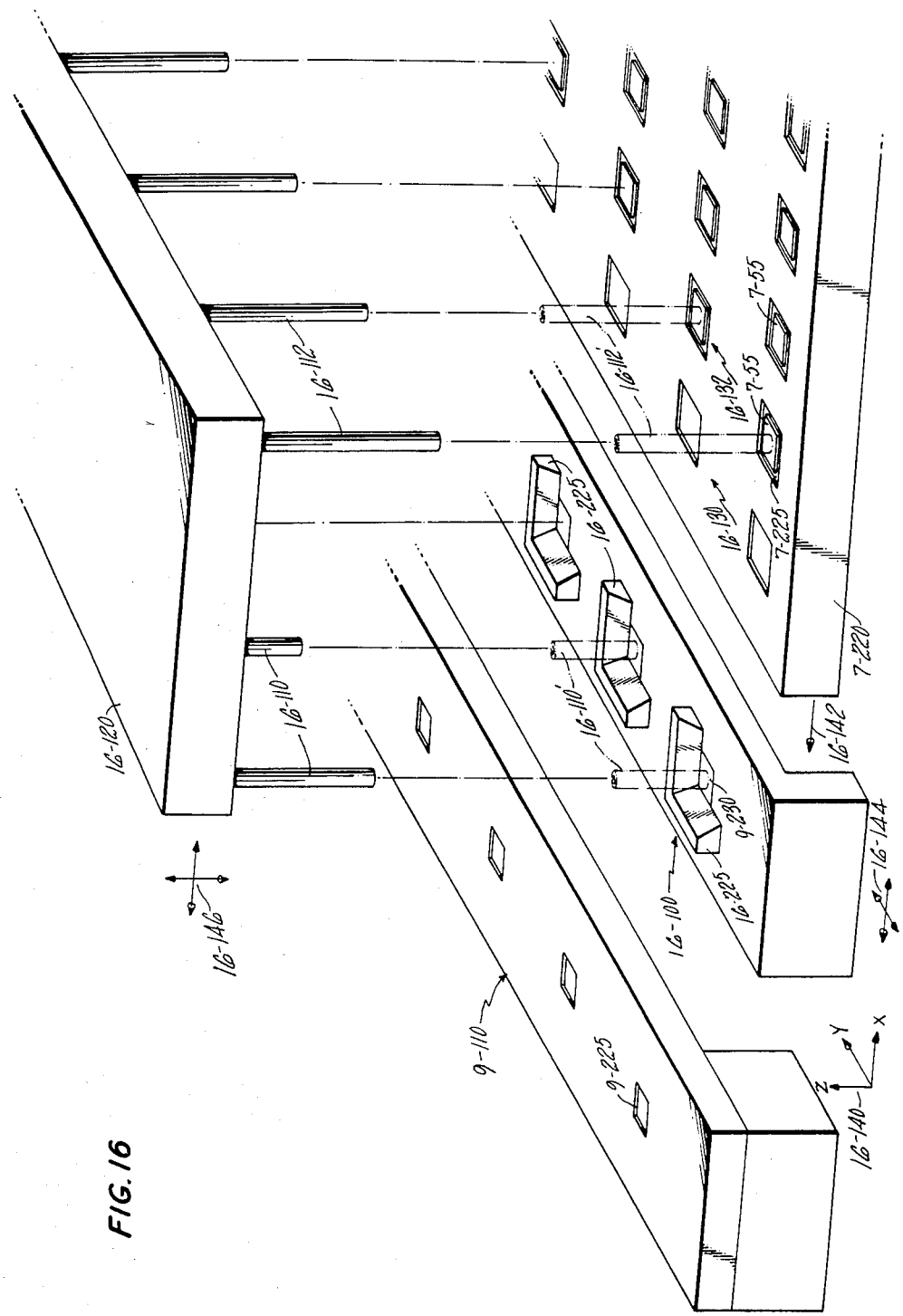
FIG. 16 illustrates a transfer apparatus for moving a set of dice in parallel.

Referring now to FIG. 16, there is shown a perspective view of a simplified transfer apparatus. FIG. 16 is an exploded view, in order to present the apparatus more clearly. Row 16-130 of waffle pack 7-220 (in this figure, a waffle pack having the spacing of the bonding fixture is used) is empty, having had its dice, indicated by the numerals 9-230, placed in preciser 16-100 by pick-up fixture 16-120. In the step illustrated, fixture 16-120 is about to pick up simultaneously row 16-132 of dice 7-55 in receptacles 7-225 of waffle pack 7-220 and the row of dice 9-230 in alignment fixtures 16-225 of preciser 16-100.

The dice will be held by vacuum to the tips of gripping probes 16-112 and 16-110, which vacuum is distributed by a conventional manifold in the interior of fixture 16-120. Two pairs of probe tips 16-110' and 16-112' are shown in contact with dice 7-55 and 9-230. The probes have conventional rubber or plastic tips in order to maintain the vacuum.

When the dice have been gripped, fixture 16-120 will be lifted along the Z-axis in 16-140 and translated to the left along the x-axis, so that probes 16-110 carrying aligned dice will be located above receptacles 9-225 in lower bonding fixture 9-110 and probes 16-112 carrying unaligned dice from row 16-132 will be located above preciser angles 16-225 in preciser 16-100. As a convention, the receptacles or alignment fixtures are referred to as -225, with the prefix on the identifying numeral indicating a drawing that shows further relevant information. Fixture 16-120 is to be lowered and the vacuum released, so that dice are simultaneously deposited in the bonding fixture and the preciser.

The function of preciser 16-100 is indicated by its name. The dice in waffle pack 7-220 are resting at random within oversized receptacles 7-225, which are made with a loose tolerance (typically ⅛ inches greater in length) to a facilitate fast transfer. Preciser 16-100 receives the dice and, by tapered surfaces on preciser angles 16-225, guides the dice into position at the corners with a typical tolerance of 0.002 inches that is sufficient to allow for reliable insertion into bonding fixture 9-110. In order to allow for tolerances in the position of dice 7-55, preciser 16-100 may be offset along the x and y axes, as indicated by arrows 16-144, to ensure that all dice make contact with the tapered sides. If that is done, then fixture 9-110 will also be offset to match the spacing of probes 16-110 and 16-112. Preciser 16-100 may also be moved to positions that will accept different size dice as shown by arrows 16-144. If the preciser is to operate with standard dice, then rectangles may be used instead of preciser angles 16-225.

In the embodiment illustrated, waffle pack 7-220 has several rows of dice, 16-132 being the curent row. The waffle pack has slid below preciser 16-100 in order to present row 16-132 at the correct position. As a consequence, fixture 16-120 must have probes 16-110 and 16-112 offset vertically by an amount that will allow clearance below preciser 16-100 for waffle pack 7-220. Also, fixture 9-110 will have to be positioned with respect to preciser 16-100 by the same vertical and horizontal displacement as that between waffle pack 7-220 and preciser 16-100, in order to receive the dice. Supporting members and mechanisms for translating the waffle pack, preciser, bonding fixture and pickup fixture are omitted from the drawing in order to represent the essential spatial relationship of the apparatus with the greatest clarity. Those skilled in the art will readily be able to add any of a number of one or two dimensional drives to effect the motion. Illustratively, waffle pack 7-220 and bonding fixture 9-110 may be placed and removed by the same general purpose robot having a conventional gripper. Pickup fixture 16-120 may be moved by a dedicated two-dimensional translator.

BOND

Figure 9:
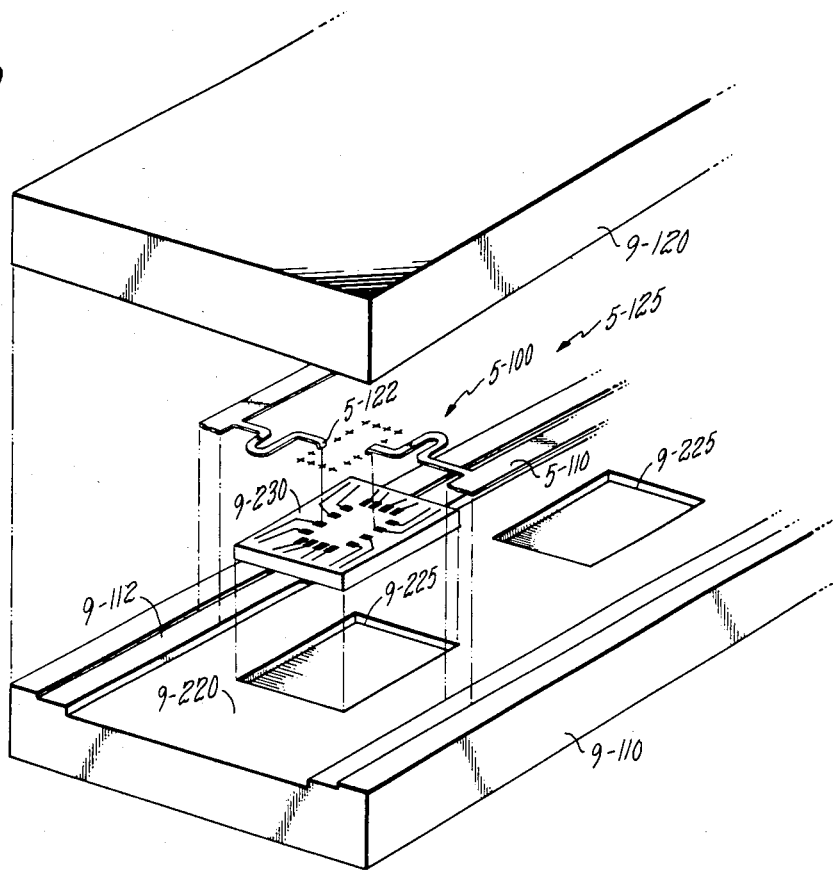
FIG. 9 illustrates a carrier used to hold a leadframe and die during the bonding step.

The assembly for the final bonding step (Step V in FIG. 1 and Leadframe Fixture Assemble, Bond, Disassemble in FIG. 2) is shown in an exploded view in FIG. 9, in which holder 9-110, represented schematically, holds 14 chips with the correct spacing, only two of the receptacles 9-225 being shown. Above receptacle 9-225, there is positioned chip 9-230 and, above the chip, a set of finger contacts 5-122 in leadframe 5-100, part of leadframe strip 5-125. The details of the leadframe will be described below. Cover 9-120 presses down on edge 5-110 of leadframe strip 5-125, which edges rest on shelves 9-112 to position the outer parts of the strip so that the contact tips will be deflected slightly. This deflection is done to compensate for inevitable fluctuations in the position of the tips during the manufacturing process, so that reliable contact is ensured during the bonding operation. The deflection is effected by making the depth of receptacle 9-225 such that the top of chip 9-230 projects above the plane of shelves 9-112 by a set amount. The amount of deflection, (0.005 inch to 0.007 inch) is illustratively several standard deviations of the nominal fluctuation of the tip position to ensure reliable joint formation. The edges 5-110 of leadframe strip 5-125 will be forced on to shelves 9-112 by cover 9-120 and tips 5-122 will thus be pressed against the pads by the spring constant of the leads.

Figure 5:
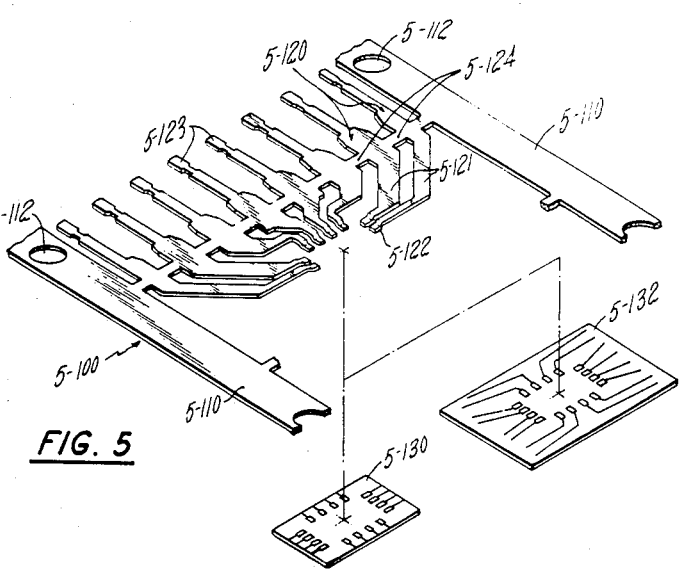
FIG. 5 illustrates a portion of a leadframe.

A typical leadframe used in the invention is illustrated in FIG. 5, in which half of an individual frame is shown. The individual leadframes are stamped out of a ribbon of metal that may be an inexpensive copper alloy, in contrast to the expensive alloy having the correct thermal properties that is used in the standard prior art process. Strips 5-110 on either side of the ribbon serve to carry the actual leads 5-120 along. Leads 5-120 have an exterior end 5-123, shaped either for insertion in a socket or for surface-mounting, and an interior portion 5-121 for attachment to a die. The two portions are joined by segments 5-124 that will be severed after the bonding step. Holes 5-112 are provided to give a reference in positioning the leadframe. At the end of each lead segment 5-121, there is a region, 5-122, in which the lead is bent in a quarter circle (or bent twice to form a parallel contact section) to form a standard dimension flat contact area. Each of the different lead segments, 5-121, with its different length, has been shaped to provide substantially the same spring constant so that the contact areas 5-122 will be uniformly pressed against the mating pads on the die to give correct alignment for the soldering operation. The leads 5-120 have been tinned with solder in a previous step in the fabrication of the leadframe ribbon.

It is an advantageous feature of the invention, but not an essential one, that a family of chips that have the same number of pins have the same standard pad array on top of the dielectric. For illustration, two dice 5-130 and 5-132 of different size are shown together with the leadframe. With this feature, it will then be necessary to have only one ribbon of leadframes for the entire family of chips, with substantial savings in inventory.

It is not necessary for the practice of the invention in its broadest sense that the dice be placed in the bonding fixture first, with the leadframe above. It may be convenient to put the leadframe on the bottom, with contacts up, and place the dice above, with contacts down. This alternate method would permit the dice to fall directly into the bonding fixture, eliminating the inversion step.

As a further alternative, it may be preferable in some circumstances to knock the dice up instead of down. In that case, the wafer is on the upper side of the adhesive tape and the striking assembly is below. A complaint vacuum gripper is placed in contact with the selected die before the striking step and draws it away when the adhesive grip is released by the striking action. The die (contact side up) is immediately placed in the bonding fixture, with any necessary precising being done as an intermediate step, either in a separate fixture or by means of tapered edges on the lower bonding fixture.

Both the contact pads 342 of the die and the tips 5-122 have been tinned and are ready to be heated. The bonding is done by a vapor phase reflow soldering technique or other means of heating the materials to reflow the fusible alloys. These alternative techniques include infra-red heating, conveyor ovens, hot gas heating or laser heating. In vapor phase reflow, a liquid such as Flourinert FC-71 is maintained at its boiling point, the liquid having been selected so that its boiling point is above the soldering temperature. The soldering assembly of holders 9-110 and 9-120, with chips plus leadframe maintained in alignment, is inserted into a container or oven that is filled with the vapor at the boiling-point temperature and held there until the solder has melted and flowed to form a bond. A typical length of time for the heating cycle is 5 to 15 seconds. This boiling point temperature is typically above 225 degrees C. but below 300 degrees C. In contrast, the present wire bonding and die attach steps are performed at temperatures of up to 460 degrees C. and peformed individually. In order to reduce the length of the heating cycle, the bonding fixture should have low mass and many apertures to permit the vapor to flow freely about the solder joints. Holders 9-110 and 9-120 have been shown schematically in order to reduce the complexity of the drawing.

An important economic benefit of this invention is that all the leads are soldered at the same time. This is in contrast to the wire-bonding technique, in which the leads must be bonded one by one. The soldering step takes no longer for a 28 pin chip than it does for a 16 pin chip.

INSPECT

The next stage (Step VI in FIG. 1) of the assembly sequence is an optional inspection operation in which the mechanical and electrical integrity of the solder bonds is checked. There are many testing mechanisms known in the art, such as pulling on the chip to test the mechanical strength of the joint; placing probes on the edge of the standard pad and the leadframe to test for electrical continuity; or optically examing the lump of solder.

Figure 12:
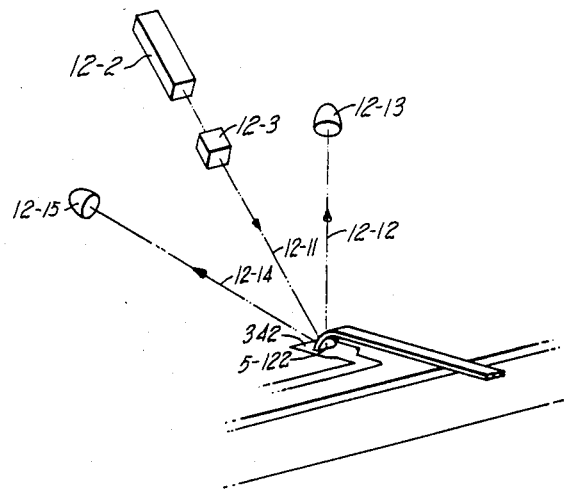
FIG. 12 illustrates a simplified optical inspection device for leadframe to die bonds.

The apparatus illustrated in simplified form in FIG. 12 is an optical test, in which the leadframe strip is taken from holder 9-110 and presented for inspection as an intermediate step in the process of loading a cassette for transport to the molding station. Optical source 12-2, illustratively a semiconductor diode or semiconductor laser, generates a beam 12-11 that passes through power monitoring device 12-3 that measures the input beam power. Beam 12-11 strikes the solder at lead tip 5-122 and reflects in several directions, the exact distribution of reflected power being dependent on the detailed shape of the solder lump and therefore varying from chip to chip. Two detectors 12-13 and 12-15 detect some of the reflected light. Preferably, these detectors have sufficient area to integrate out small fluctuations in the intensity distribution. If lead tip 5-122 did not make contact with the pad, there will be a gap instead of a smooth solder surface and very little light will be reflected. In order to pass the test, both detectors 12-15 and 12-13 must receive a certain fraction of the signal in monitor 12-3. The threshold will be set empirically when the production line is initially put into operation.

All leads on all 14 chips may be tested; only one lead per 14-chip unit may be tested; or anything in between. The number of tests will depend on the usual cost/reliability trade-offs. One suitable method is for the robot 10-23 of FIG. 10 to move the leadframe strip at a fixed speed past beam 12-11. The signals in detectors 12-15 and 12-13 are sampled when beam 12-11 strikes the point where a bond should be. The individual bonds are thus identified by the time at which they pass through the beam.

MOLD

In the next major step, (Step VII in FIG. 1), leadframe 5-100, with 14 chips attached, is placed into a transfer or injection molding machine to mold plastic about it, thus encapsulating and protecting the chip. The molding process will be done using conventional techniques and equipment. It is an advantageous feature of this invention that the wide contact area between the leadframe and the contact pads is extremely rugged compared to the wire bonding technique that is in standard use so that a far smaller fraction of chips will be damaged during handling and the chips can be moved about at a greater rate and with less delicacy required. It is a further advantage that the leads conduct heat away from the chip during operation.

After the encapsulated dice, (still in the leadframe) are removed from the molding machine, the optional labelling step of FIG. 2 is performed. The dice identity first appeared during probe test, when data were measured that applied to an individual die. That identity was preserved by the labels on the wafer, tape frame and leadframe, the computer being updated as required to log the die identity on the leadframe. Each chip may be marked by a laser branding process or any other convenient technique with an identifying label, test results, etc.

The conventional "dejunk" step, in which excess plastic is removed from the leads is also performed at this time.

TRIM/FORM

Next, in step VIII of FIG. 1, the chip plus leadframe combination is separated from the ribbon and the spacing segments 5-124 that served to maintain the leads in correct alignment are severed. If the ribbon is formed from a sheet of copper or copper alloy, it is necessary to sever the connections 5-124 or else all the leads will be shorted together. If another version of the ribbon is used, in which a plastic backing is used for the portion 5-110 and to support leads 5-120, on top of which a plated copper lead has been formed, then it will be easy to maintain the sections 5-124 in plastic and it is not necessary to separate the leads.

LEADFRAME DETAIL

Figure 11A:
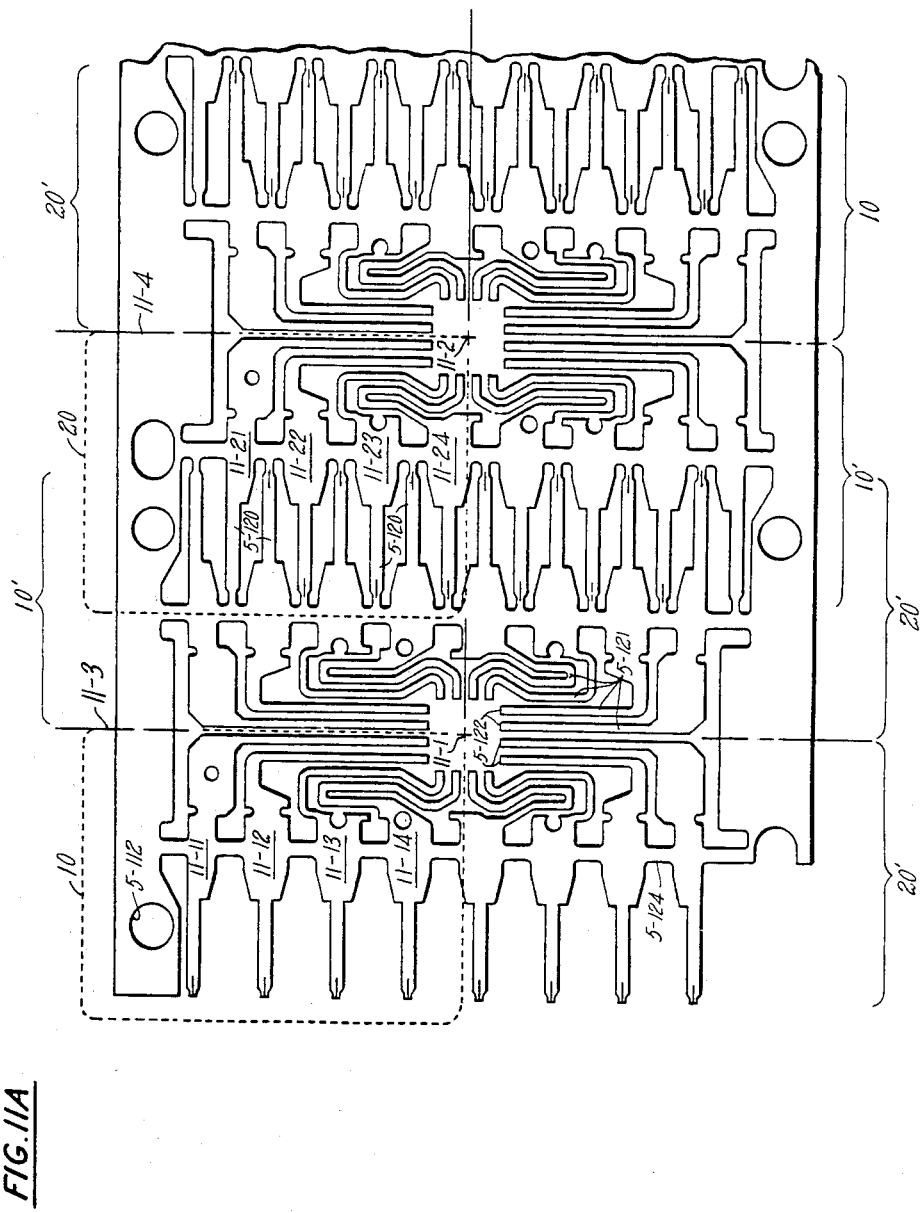
FIGS. 11A–11C illustrate a leadframe design suitable for 16-pin dice.
Figure 11B:
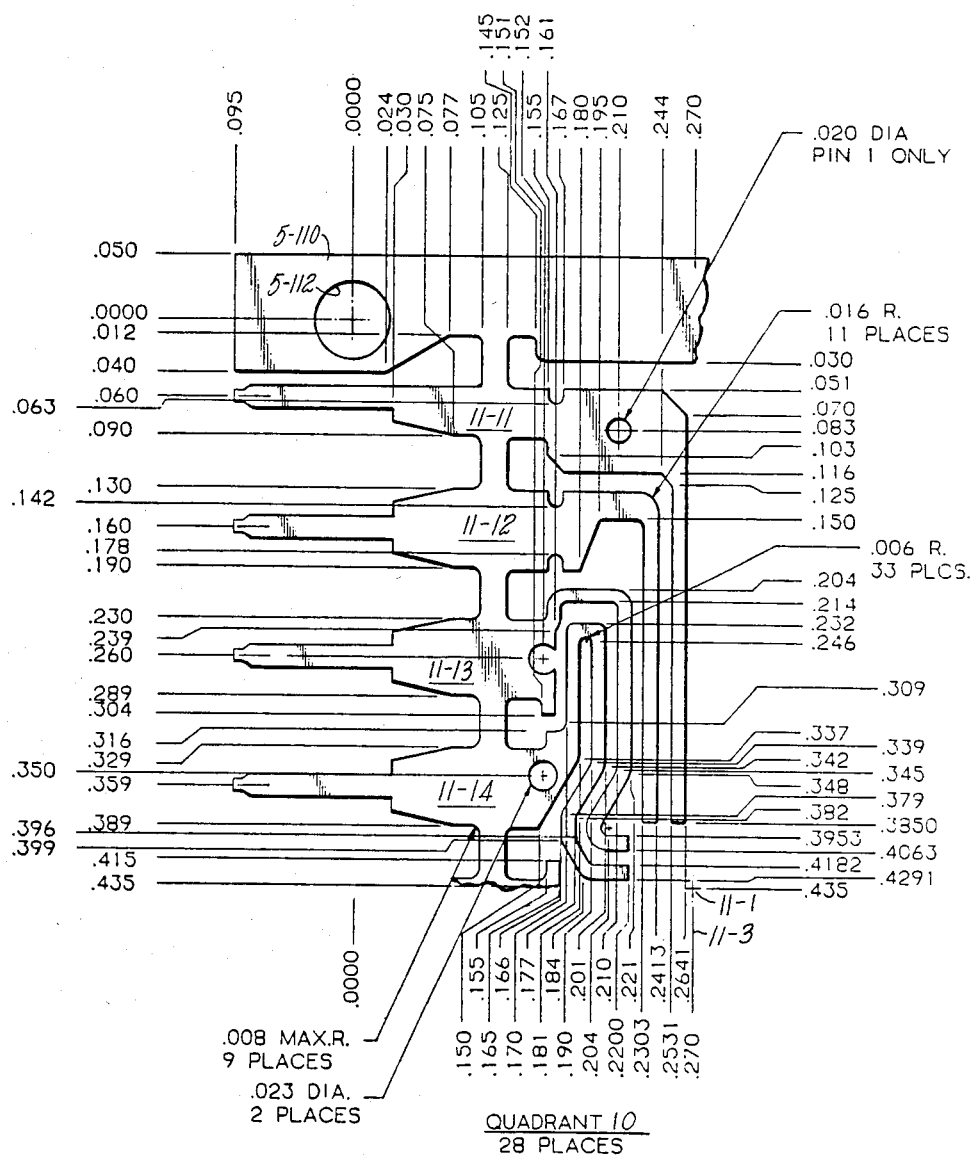
Figure 11C:
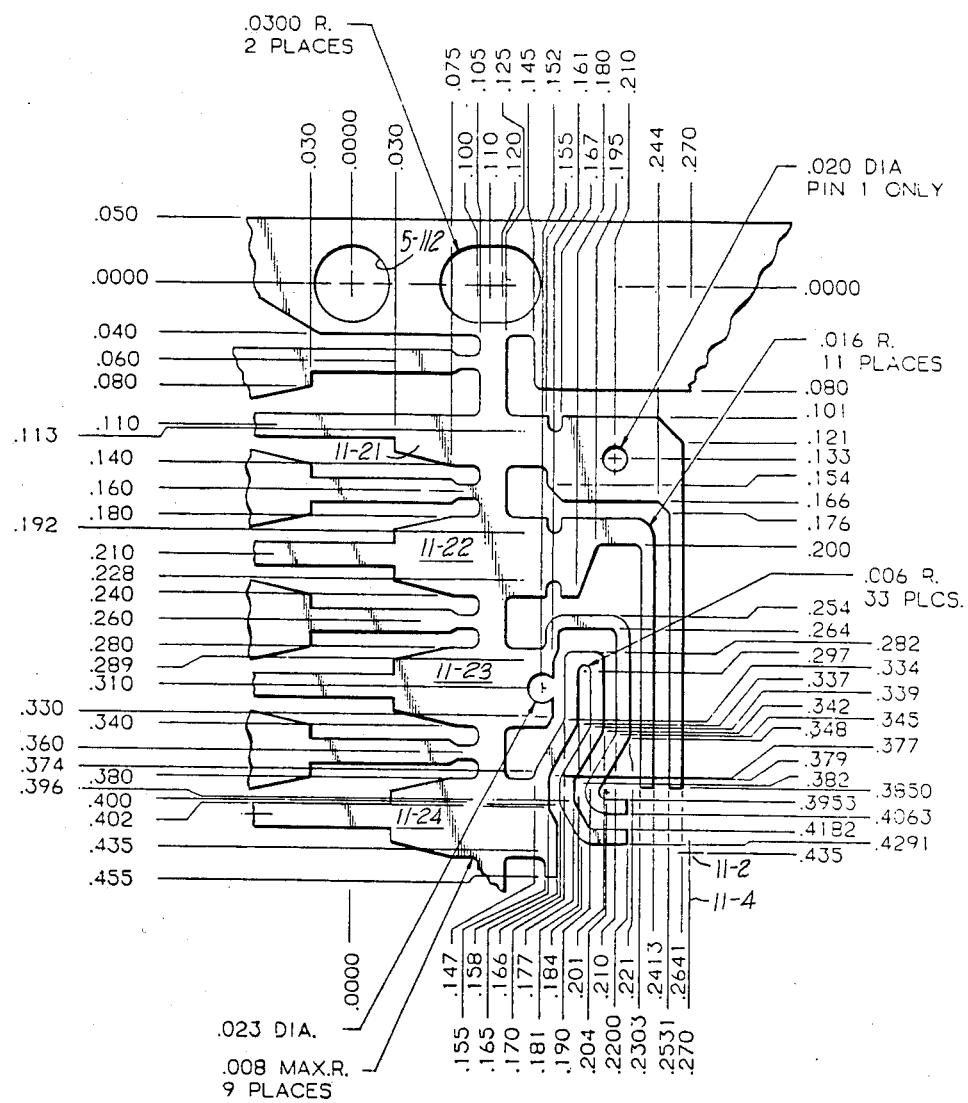

The illustration in FIG. 5 is general in nature, for the purpose of illustrating the broadest version of leadframe to die bonding principles usable in the invention. More leadframe detail is shown in FIG. 11, in which FIG. 11A is a top view of a portion of a leadframe strip containing two leadframes centered on points 1 and 2 respectively.

The figure is crowded because of one advantageous feature of the invention, which is that the exterior portions 5-123 of adjacent leadframes overlap ("interdigitated" in conventional terminology), thus reducing the amount of scrap that is produced when the leads are stamped or etched out of the metal ribbon. It would also be simple to overlap the portions 5-121 by offsetting every other leadframe by one half the distance between leads 5-120, but then the chip location in the fixture would also have to be offset, which would make the die loading into the fixture process more complex.

Each 16-pin leadframe is formed from four quadrants 10, 10', 20 and 20'. Quadrants 10 and 10', are mirror images reflected through centerlines 11-3 or 11-4; as are quadrants 20 and 20'. The difference between quadrants 10 and 20 is the shape of fingers 5-121 that extend from joining strips 5-124 to contact pads 5-122 of the individual leads. Two sets of four leads 11-11 to 11-14 and 11-21 to 11-24 are shown in FIG. 11A and in more detail in FIGS. 11B and 11C, respectively.

In order to show the most complete details of the leadframe, the pertinent portions of working drawings have been reproduced. The numerals with a decimal point are dimensions in inches in a rectangular coordinate system having its origin at the center of hole 5-112. For example, finger 11-11 of quadrant 10 has a width of 0.2641 inch–0.2531 inch or 0.011 inch and is separated from finger 12 by 0.2531 inch–0.2413 inch or 0.012 inch.

Fingers 5-121 have been designed to have the same spring constant; in this embodiment 0.025 mm deflection for 981 dynes, (1 to 2 grams force per 1-mil of deflection) in order to ensure reliable contact between finger tip 5-122 and pad 342. Tips 5-122 are formed by bending fingers 5-121 with a radius of curvature of 0.010 inch, resulting in a contact tip that is nominally 0.01 inch square.

The particular leadframe illustrated has external leads 5-120 conforming to industry standards for a 16-pin D.I.P. The material is OLIN 195, ¾ hard, with thickness 0.010+0.0005 inch before plating. The solder plating is tin-lead 200–350 microinches thick, with a tin content between 88% and 98%, the balance lead.

Centerlines 11-3 and 11-4 of FIG. 11a are separated by 0.540 inches, resulting in a set of 14 leadframes that has an overall length of 7.75 inches.

Many other designs for fingers 5-121 can be made by those skilled in the art in the light of this disclosure. It is not essential for the practice of the invention that fingers 5-121 have exactly the same spring constant and substantial variation is permissible.

MACHINE LAYOUT

Figure 10:
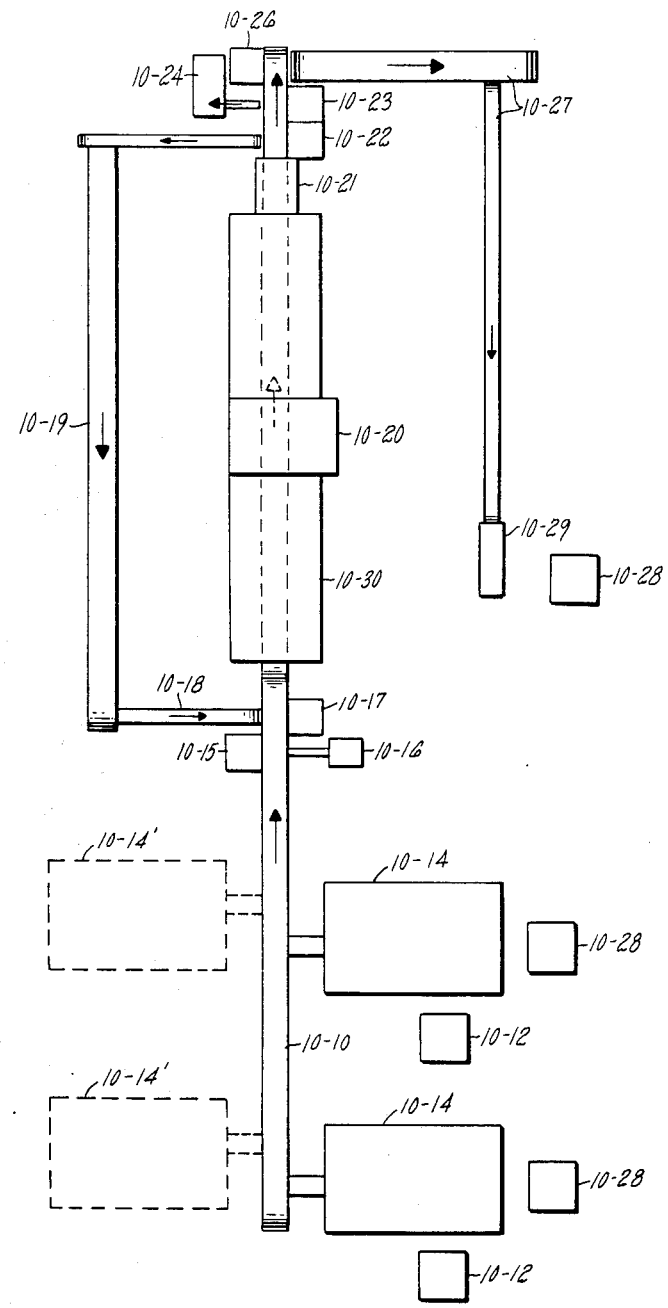
FIG. 10 illustrates a layout for machines used in automatic die to leadframe attachment.

FIG. 10 shows, in partially schematic, partially pictorial form, the portion of the method that takes the array of dice from the sawn wafer and produces a leadframe with dice soldered to it (Steps IV and V in FIG. I).

Figure 8C:
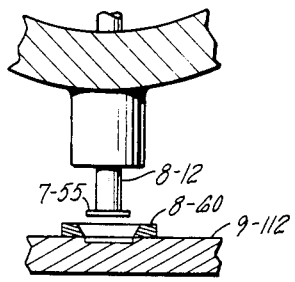

Box 10-12 is a schematic representation of a cassette or rack containing a number of tape frames 430 that have passed through the sawing operation and perhaps the optional inspection step. Box 10-28 is a schematic representation of a cart or other holder that keeps a supply of lower bonding fixtures 9-110. Box 10-14 is a schematic representation of an assemblage of devices including a bar code reading station 7-10, at least one pick down station 7-100 (FIG. 7A) and at least one robot such as a Seiko RT-3000 that performs material handling steps such as moving film frames from one station to another; inverting the dice in waffle pack 7-220 (FIGS. 13, 14, 15); transferring the dice from inverted waffle pack 7-220' to bonding fixture 9-110 (FIG. 16); and placing the filled fixture 9-110 on conveyor 10-10. In a preferred embodiment, the work station includes one robot having a gripper adapted for handling the waffle packs and tape frames; two pick-down stations, one inversion station and one bar code reader. A second robot with a specialized vacuum pickup transfers the inverted dice from a waffle pack to a "preciser", which is a fixture that aligns the corners of the dice to the correct tolerance. If only a single corner is aligned, the preciser may be used with dice of different sizes. If the dice are inverted sequentially then, as shown in FIG. 8, the inversion device will be located in pick-down station 7-100 and the mass transfer device of FIG. 16 will not be used.

In FIG. 10, conveyor 10-10 receives lower bond fixture 9-110 from the transfer station of FIG. 16 and moves it to a series of stations in which a leadframe strip is placed above the die and upper bond fixture 9-120 is placed above the leadframe assembly.

Four work stations 10-14 are shown. The number actually used in any situation may vary, of course, depending on the throughput that can be handled by the bonding stage, or whatever the particular limiting factor may be.

Box 10-16 is a schematic representation of a leadframe input station that holds an accumulation of leadframes and presents them to robot 10-15, illustratively a Seiko PN-100, that places a 14-chip leadframe above the dice in lower bond fixture 9-110. Unit 10-16 may be simply a magazine of precut leadframe strips or it may be a roll of leadframes with a cutting mechanism. In the magazine embodiment, a magazine is sequentially raised to an input level, and the precut strips are ejected by an air blast.

Handling the leadframes presents a difficult challenge. They are fragile and would easily be crushed by conventional grippers. Grippers with "tactile" sensors might be used, but they are expensive. Vacuum lifters cannot be used because of the many apertures in the leadframe.

Figure 17A:
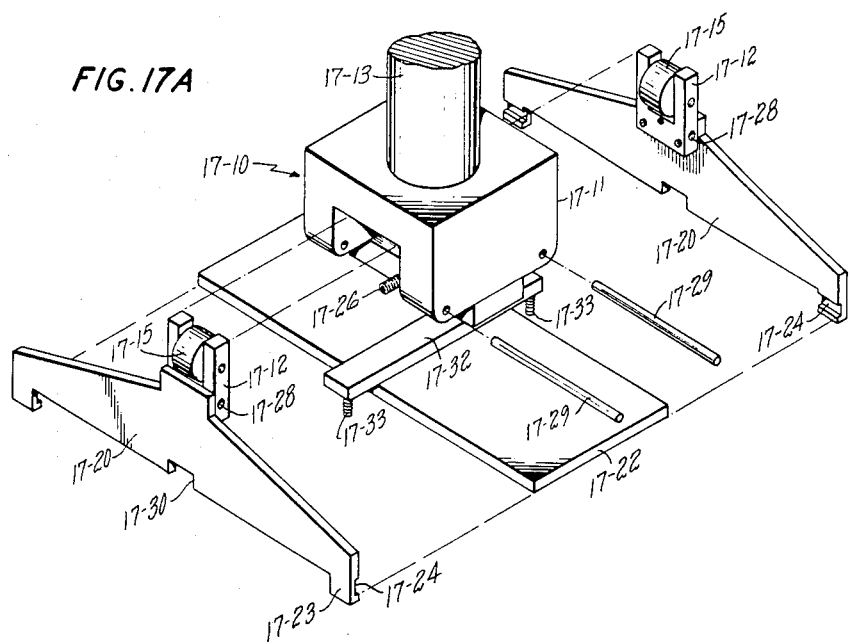
FIGS. 17A and 17B illustrate a gripper mechanism for the leadframes.
Figure 17B:
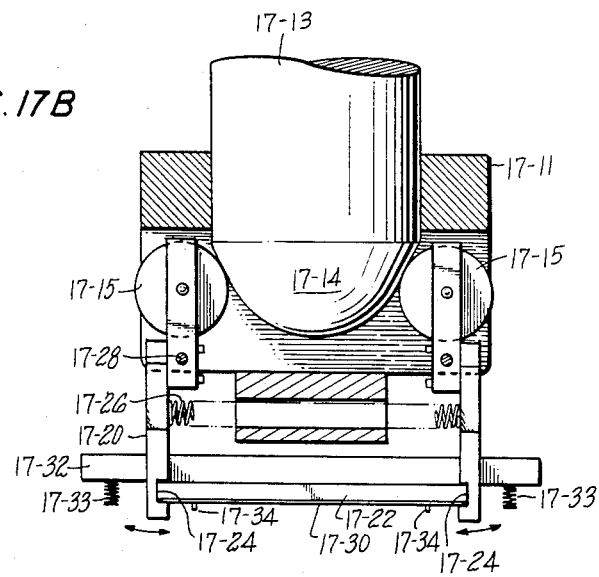

FIGS. 17A and B illustrate an economical gripping fixture that handles the task of lifting and aligning the leadframe. FIG. 17A is an exploded view and FIG. 17B is a side view of an assembled fixture. Referring now to FIG. 17B, the principle that has been adopted is the use of a "back-up bar" 17-22 to relieve the pressure that gripping fixtures 17-20 would otherwise exert. The force arises from spring 17-26, shown as connected between grippers 17-20 and pressing them apart. Other springs in different locations or other methods of exerting force may also be used.

Leadframe 17-30 is located below bar 17-22 and between notches 17-24 in extensions 17-23 of gripping fixtures 17-20. As can be seen in FIG. 17A, there are four notches 17-24. There is a nominal clearance of 0.015 inch between the bottom of bar 17-22 and the bottom of notch 17-24. Since leadframe 17-30 is only 0.010 inch thick, there is a margin of 0.005 inch.

Gripping fixtures 17-20 pivot about pivots 17-29 in response to downward pressure from cone 17-14 on rollers 17-15 attached to fixtures 17-20. Cone 17-14 is illustratively part of a commercially available air actuated cylinder with spring return, 17-10, available from the Seiko corporation. Housing 17-11 encloses cylinder 17-13, having cone 17-14 on the lower end, and provides support for pivots 17-29 through hole ends 17-28 on arms 17-12. There are four hole ends 17-28 that support both ends of each pivot 17-29. Housing 17-11 also supports bar 17-22 through a rigid support that is omitted from FIG. 17 for clarity. The motion of gripping fixture 17-20 is indicated by the arrows in FIG. 17B.

Slots 17-30 in fixtures 17-20, visible in FIG. 17A, provide clearance for spring-loaded plungers 17-33, shown schematically in the figures, as being supported by support bar 17-32 fastened to backup bar 17-22. The function of plungers 17-33 is to press against lower bond fixture 9-112 to prevent backup bar 17-22 from being held by its alignment pins to the bonding fixture.

Two alignment pins, 17-34, are shown in FIG. 17B. Pins 17-34 are located on diagonally opposite corners of bar 17-22 in order to locate bonding fixture 9-112 with respect to bar 17-22. This alignment does not align the leadframe with respect to the bonding fixture or with the dice because the holes in the leadframe through which pins 17-34 pass are oversized. That alignment is effected by pins in the bonding fixture, not shown in the drawing, that enter selected holes in the leadframe. The bonding fixture, leadframe and gripper combination must be within a tolerance range before the alignment pins in the bonding fixture will enter the proper holes in the leadframe, of course, and that is the function of pins 17-34. There will always be errors in the exact location of pins and holes and pins 17-34 may bind in their mating holes. Plungers 17-33 are used to ensure disengagement of pins 17-34 from the bonding fixture. Leadframe 17-30 remains with the bonding fixture because the holes in the leadframe through which pins 17-34 pass have a looser tolerance than the four holes that mate with alignment pins in the bonding fixture. The combination of four pins and tighter tolerance ensures that leadframe 17-30 is held fast when the gripper is lifted.

Returning now to FIG. 10, robot 10-17, illustratively another Seiko PN-100, picks an upper bond fixture 9-120 from accumulator 10-18 (illustratively a Dorner Corporation Series 4100) that is the end of a return loop that will be discussed further below. Upper fixture 9-120 is placed above the leadframe to press it down for good bonding contact as described above. Illustratively, magnetic attraction between magnets and magnetic material in the upper and lower fixtures is used to maintain the bonding fixture in correct alignment during the bonding process.

The completed bonding fixture is placed on a second conveyor 10-30 that is part of an HTC Corporation IL-12 vapor phase heating system using Fluorinert FC-71 as a heat transfer medium. The bonding fixture passes through the system at a rate of speed that is adjusted to provide adequate heating for reliable bonding, typically spending 5–15 seconds within the vapor zone.

The bonded assembly passes to cooling station 10-21, where it rests in thermal contact with a chilled plate for a period of 30–35 seconds. The time and cooling are set to allow the solder to solidify and to allow the chip plus leadframe to reach a temperature below the reflow temperature and at which it can be handled.

The bonding fixture is then disassembled, with upper fixture 9-120 being removed by Seiko PN-100 robot 10-22 and placed on conveyor 10-19 (Dorner Corporation, Series 5000) for return to accumulator 10-18. Another robot 10-23 (another Seiko PN-100), using the gripper fixture shown in FIG. 17A, removes the bonded leadframe/dice combination and places it in magazine 10-24, a forty position 0.1 inch pitch magazine used for transport to the next station. Lower fixture 9-110 is transferred by robot 10-26 (another Seiko PN-100) to conveyor 10-27 (another Dorner Corporation, 5100 Series) for transfer to accumulation station 10-29 and subsequent transfer to cart 10-28 for return to station 10-14.

DISCRETE COMPONENT ATTACHMENT

Figure 3C:
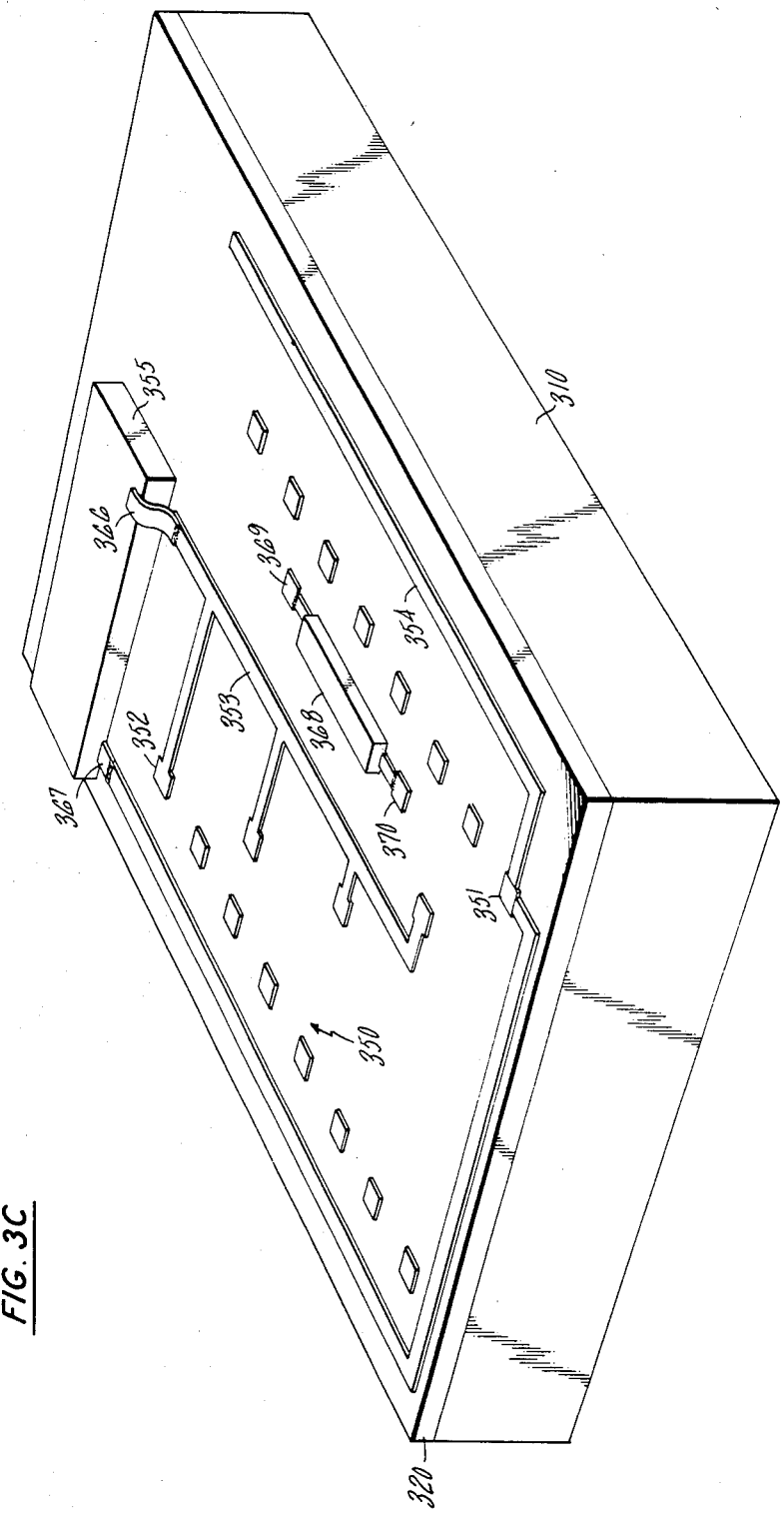
Figure 3D:
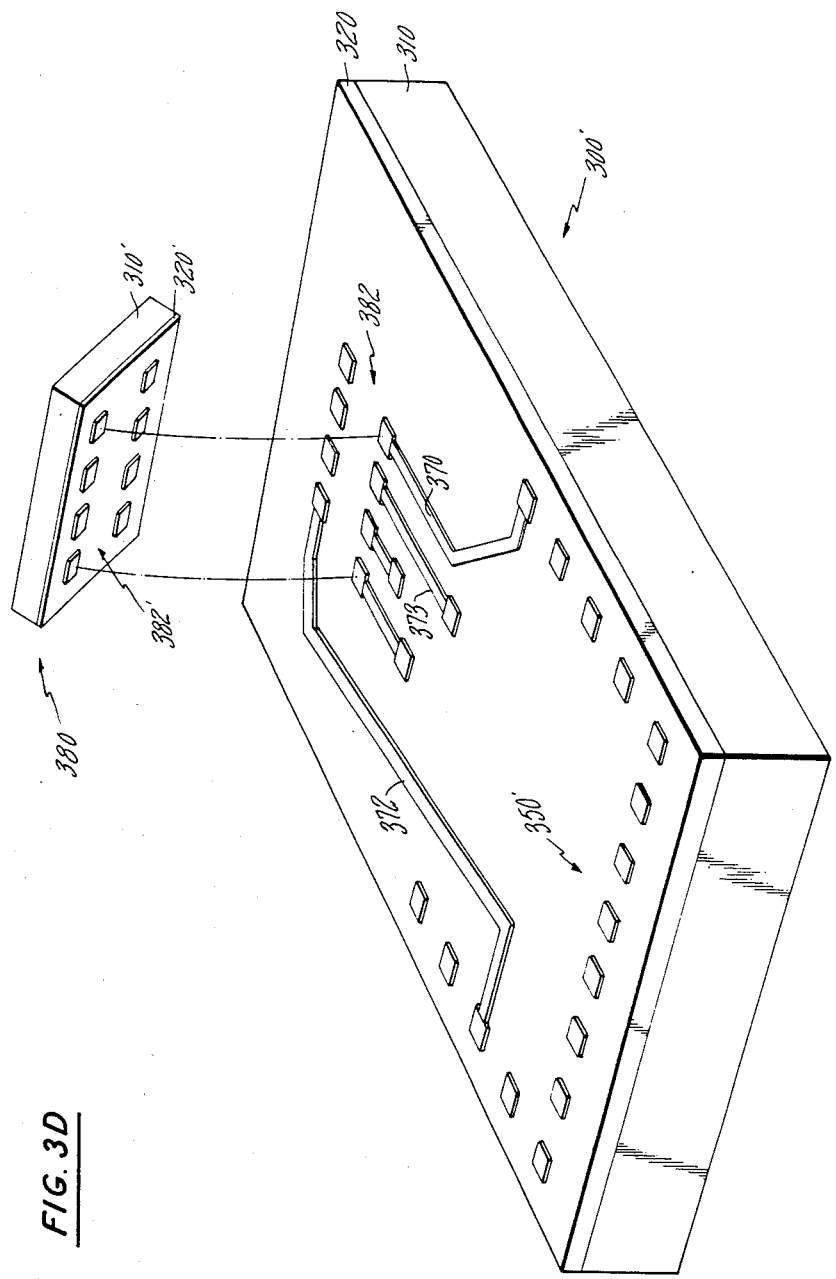

Referring now to FIGS. 3C and 3D, there is shown a variation of a die using the standard pad layout. The standard pad array of FIGS. 3A and 3B used a square outline that was sized to fit on a very small chip, so that a single leadframe could be used for the complete size range. There may be other technical or economic considerations, however, that justify a different pad array (which may still be common to a number of integrated circuits).

For example, FIG. 3C shows a die having the same substrate 310 and polyimide 320 as before, but in which the pad array comprises two rows 350 illustratively of eight pads each, set toward the outside of the chip. With the center clear, there is room for bus 353, which distributes the power supply voltage to various points in the circuit, one of which is a via indicated by the numeral 352 and positioned at one of the array positions to make contact with a lead. Compared with the prior art technique of using thin wires, bus 353 offers considerably less resistance and inductance. Similarly, bus 354 makes contact with pad 351 and distributes the ground terminal about the die.

A further advantage of the sturdy polyimide layer 320 is that discrete electrical devices, active or passive, may be placed on top of layer 320 and connected to the circuit, either by vias or to the standard pads. In FIG. 3C, device 368 is shown as being connected to vias 370 and 369. The device may be a thick-film resistor having a large magnitude (that is difficult to achieve with conventional integrated circuit techniques). It also may be a separately formed device, optionally with conventional surface-mounted-device packaging. Examples are resistors, inductors and capacitors.

One useful example of a capacitor is shown as unit 355, a charge reserve capacitor connected between the power supply and ground using a conductive adhesive at point 367 and to strap 366. Such capacitors are conventionally attached to integrated-circuit sockets to maintain a stable supply voltage when circuits switch. The economic advantages of including the capacitor with the chip are evident. A device such as unit 355 may be connected to any point in the circuit, of course.

One variation that is of great interest is the use of a separate device 355 that is an optical or other element that is difficult to fabricate on the same substrate. For example, device 355 could be a solid-state laser using a gallium arsenide substrate and die 310 could be a conventional silicon integrated circuit. In that case, a fiber-optic pigtail would be included for communication to other optical devices.

Other devices that may be readily implemented are an R-C timing network, either fixed or having an adjustable element for which an access hole is formed in the encapsulating plastic; or a power transistor using the area of device 355 to spread the heat load. Heat sinks may also be attached directly to layer 320 or to vias that provide a low impedance thermal conduction path from high-power sections of substrate 310.

These other devices may be attached in any convenient manner. They may be adhesively attached before or after the soldering of the leadframe (or they may be soldered and the leadframe adhesively attached). Alternatively, soldering or gluing of leadframe and discrete devices may be done simultaneously, with the leadframe maintained in position prior to bonding by an adhesive.

FIG. 3D illustrates another variation of the invention that offers considerable reduction in inventory. There is now a two-chip assembly comprising a first chip 300' having substrate 310, polyimide 320 and surface pads as before, and a second chip 380 comprising substrate 310', polyimide 320' and array of contacts 382' that mate with an array of contacts 382 on layer 320.

An alternate U-shaped contact array 350' is shown, which has the advantage of freeing up half of layer 320 for chip 380. In order to bring all the leads over to one half of chip 300', it may be necessary to permit some variation in the spring constant of the leads.

Only some connections between contacts 350' and 382 are shown, for power supply and ground. Chip 380 may connect directly to the leads for input/output, of course. In the case illustrated, chip 380 is a ROM that needs only power supply and ground and communicates only with the larger chip through vias in array 382 or through surface leads, such as lead 373.

One particular application of great commercial interest is that of a multi-purpose chip, such as a single-chip microcomputer that is customized by adding a ROM. If the ROM is a mask option, then there must be a reserve supply of customized microcomputers to allow for fluctuations in the yield, or rush orders and the manufacturer must maintain an inventory of chips that are good only for one customer. With the embodiment of FIG. 3D, however, the inventory for each customer need only be his ROMs, which are much cheaper than microcomputers. The manufacturer will maintain a reserve of microcomputer chips sufficient to meet the needs of all his customers, of course. It is evident that the total value of inventory will be less with a central reserve, simply because of the laws of statistics.

A variation of the two-chip system is that in which the main chip 302 is a generalized system, such as an input controller and the second chip 380 is one of a number of alternatives, each customized for a particular application. For example, the main chip might be a 5-volt logic chip and chip 380 might be designed to withstand the high voltages of the telephone network in a telephone interface such as a modem or coder.

Many other applications of the second chip, such as interfaces to different manufacturers' computers for plug-compatible systems; or the implementation of one of a number of standard logical functions, such as a parallel output or a serial output, will be evident to those skilled in the art.

One convenient method of attaching chip 380 is to form pads 382' with a sufficient amount of high temperature solder to make reliable contact and to reflow that bond before bonding the leads at a lower temperature.

Another method is to adhesively attach chip 382 in alignment and to solder both sets of contacts simultaneously.

IMPEDANCE-MATCHED LEADS

Figure 18A:
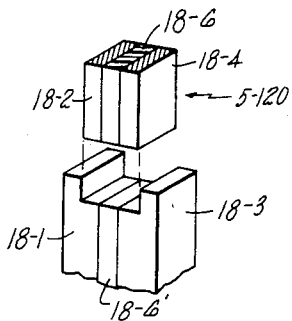
FIGS. 18A and 18B illustrate an alternate leadframe having a specified impedance.
Figure 18B:
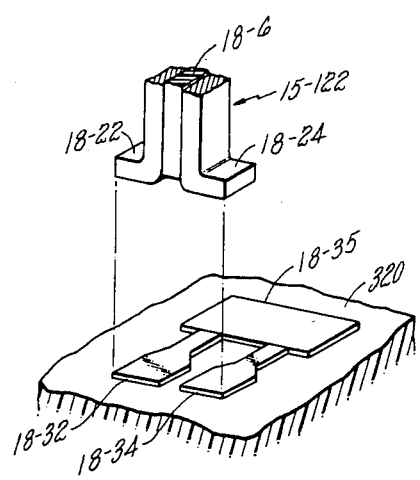
Figure 19:
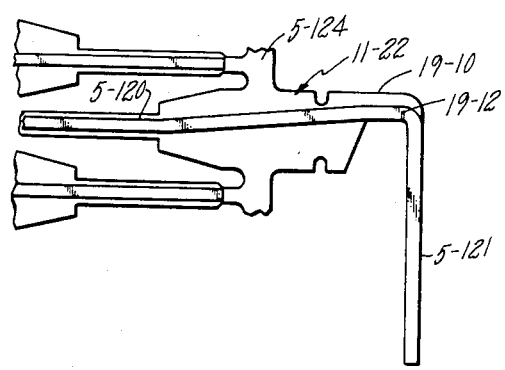
FIG. 19 illustrates a portion of the leadframe of FIG. 18.

An alternate form of leadframe, shown in FIGS. 18 and 19, has the improved feature that the impedance of the leads is a particular value that is matched to the rest of the circuit in which the integrated circuit chip is inserted in order to improve the transmission of signals to and from the chip. The improved leadframe has the same general form as that shown in FIGS. 5 and 11. The major difference in construction is that the material of the leadframe is now a sandwich construction having two layers of conductor with a dielectric inbetween. The thickness of the dielectric and the shape of the leads are chosen to produce the desired impedance.

The reason for using a more complex lead structure is that, in high frequency integrated circuits, the fundamental frequency of a 1 nanosecond pulse is 1 GHz and the bandwidth required to pass such a pulse cleanly is 13 GHz. In this high frequency regime, the packaging of the integrated circuit becomes a limiting factor and the rise time of the lead connecting the integrating circuit with the rest of the system limits the bandwidth of the circuit itself. A further problem of such high frequency systems is that an impedance mismatch between the printed circuit socket or other connector and the lead gives rise to reflections that can cause erroneous results when the circuits respond on a sub-nanosecond time scale.

With the present method of attaching integrated circuits by wire-bonding, a narrow wire having a diameter on the order of 1 mil is used to join the relatively wide leadframe to the integrated circuit chip. Such a narrow diameter wire, of course, has a high inductance associated with it and the impedance mismatch between the wire and the leadframe gives rise to reflections and also to a bandwidth limitation.

Referring now to FIG. 18A, there is shown a portion of a lead indicated generally by the numeral 5-120, referring to the external portion of the lead in FIG. 5. The lead tip is shown comprising a sandwich of a first conductor 18-2, the dielectric 18-6 and the other conductor 18-4. This lead tip is shown above a socket having a first side 18-1 and a second side 18-3 which make electrical contact with the respective conductor layers of the lead tip. One of these electrical conductors will be the ground and the other will carry the signal. The socket is shaped to match the impedance of the lead. Fabrication of this "sandwich" construction is straightforward. Illustratively, the overall leadframe is formed from a sheet of polyimide, laminated between two conductors and the leads are shaped by stamping or etching.

The standard strip transmission line formula is $Z=120\pi/(\epsilon_r S/W)$; where $\epsilon_r$ is the dielectric constant, S is the separation of the two conductors and W is the width of the lead. Application of this formula to an example in which the width is 10 mils; the thickness of the dielectric is 5 mils; and the material is polyimide, having a dielectric constant of 3.5; the characteristic impedance is calculated to be 50 ohms, which fits well with a commonly used impedance in RF circuits. Those skilled in the art will readily be able to devise different lead constructions for different desired values of impedance.

Referring now to FIG. 18B, the tip 5-122 (the "die tip") of lead 5-121 is shown, in which members 18-22 and 18-24 are the conductors 18-2 and 18-4, bent to provide for easy attachment to contacts on the integrated circuit chip. Suitable contacts, shown as 18-32 and 18-34 are pre-tinned contact pads constructed as indicated above in the description of FIG. 3. The transmission line lead 5-122 is terminated by resistor 18-35, which is a discrete resistor formed by thick-film techniques, having the same impedance as the transmission line.

This same attachment technique may be used on the external tips 5-120 of the leadframe if the chip is to be used in a surface mounted device configuration.

Referring now to FIG. 19, a single lead 11-22 from FIG. 11 is shown, having external lead tip 5-123 and lead die tip 5-121. In this case, in order to provide the maximum smoothness in impedance change and the minimum amount of reflections, a single width strip conductor 19-12 having the same width throughout is used. The body 19-10 of this area of lead 11-22 is formed from the dielectric (18-6 in FIG. 18A) and the single narrow strip 19-12 is formed from the conductor. In this way, the reflections and impedance changes that would result from changing the shape of the transmission line are avoided. An additional benefit is that since the segment 5-124 which had to be trimmed away in the embodiment of FIG. 5, is now dielectric, that trimming step may be eliminated, since the leads may remain attached to one another by the plastic with no adverse effect on signal propagation. It is not necessary that a single-width strip be used, and the cross section of the strip may vary, subject to the requirements imposed the bandwidth of the packaging material by the system application in question.

Those skilled in the art will readily be able to devise many different systems having various features or alternative features of the embodiments described above. The overall system includes many different optional features that are not necessary to the practice of the invention in its broadest form. In particular, many of the automated steps of material handling are optional and will be included only in very high-volume systems, with lower-volume systems using manual performance of some of the steps.

As used in this application the term "integrated circuit" refers to an assemblage of circuit elements that cooperate to form some electrical function. It is not necessary that the circuit be fully complete, since discrete elements such as bus bars, resistors and capacitors may be added on top of the polyimide. The term "dielectric top coating" refers to the layer 320, preferably but not necessarily a polyimide, that separates the conventional integrated circuit structure below from the leads, contacts and possible discrete devices above.

We claim:
1. A method of processing semiconductor integrated circuit devices comprising the steps of:
   a. applying a dielectric top coating having a top surface over at least two integrated circuits on a wafer;
   b. forming at least two arrays of conductive leads from predetermined nodes of said integrated circuits along said top surface of said dielectric top coating to at least two corresponding predetermined arrays of electrical contacts disposed on said top surface of said dielectric above each of said at least two circuits;

c. separating said at least two circuits to form at least two circuit chips by cutting entirely through said wafer while leaving a cover portion of said dielectric above each of said integrated circuits and below said standard arrays;
d. removing a selected chip from said at least two circuit chips by striking an adhesive support member having an adhesive side to which said selected chip is attached and an opposite side at a point on said opposite side opposite said selected chip, thereby releasing said chip from said adhesive;
e. positioning a leadframe, having an array of contact members disposed in a lead contact array positionally matching said predetermined array of electrical contacts, in alignment with said selected chip so that said lead contact array touches said array of electrical contacts, said at least two predetermined arrays of electrical contacts being sized to fit on at least two different integrated circuit chips so that said leadframe may be used with more than one integrated circuit; and
f. conductively bonding at least two of said array of electrical contracts to said lead contact array simultaneously.

2. A method according to claim 1, in which said selected chip is selected automatically, under stored program control, in response to test results from a further step of electrically testing said at least two chips.

3. A method according to claim 2, in which said step of removing said selected chip by striking said adhesive support member is performed under stored program and memory control.

4. A method according to claim 3, in which said released chip and said leadframe are sequentially placed in an alignment fixture for performing said positioning step.

5. A method according to claim 4, in which said leadframe is inserted into said alignment fixture and said selected chip is then placed in alignment therewith.

6. A method according to claim 4, in which said selected chip is inserted in said alignment fixture and said leadframe is then placed in alignment therewith.

7. A method according to claim 4, in which at least two released chips and at least two leadframes are placed in said alignment fixture for the simultaneous bonding of at least two arrays of electrical contacts to at least two lead contact arrays.

* * * * *